United States Patent
Ibrahim et al.

(10) Patent No.: US 8,050,647 B2
(45) Date of Patent: *Nov. 1, 2011

(54) METHOD AND SYSTEM FOR FREQUENCY FEEDBACK ADJUSTMENT IN DIGITAL RECEIVERS

(75) Inventors: Brima Ibrahim, Aliso Viejo, CA (US);
Hea Joung Kim, Irvine, CA (US);
Henrik Tholstrup Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/563,765

(22) Filed: Sep. 21, 2009

(65) Prior Publication Data
US 2010/0009673 A1      Jan. 14, 2010

Related U.S. Application Data

(63) Continuation of application No. 11/102,123, filed on Apr. 8, 2005, now Pat. No. 7,599,662, which is a continuation-in-part of application No. 10/134,797, filed on Apr. 29, 2002, now Pat. No. 7,079,595.

(60) Provisional application No. 60/623,963, filed on Nov. 1, 2004.

(51) Int. Cl.
*H04B 1/20* (2006.01)
(52) U.S. Cl. ........................................ 455/313
(58) Field of Classification Search ........... 455/41.2, 455/67.11, 258, 267, 260, 76, 115.1, 226.1, 455/323, 334, 340, 304, 302, 296, 422, 63.1, 455/7, 71, 75, 105, 112, 113, 118, 119, 131, 455/136, 139, 150.1, 154.1, 164.1, 173.1, 455/182.1, 190.1, 192.1, 196.1, 205, 227, 455/313, 239.1; 330/129; 375/319, 286–287, 375/372–376, 325–327, 344
See application file for complete search history.

(56) References Cited

U.S. PATENT DOCUMENTS
4,803,703 A    2/1989    DeLuca et al.
(Continued)

FOREIGN PATENT DOCUMENTS
CN           1416223 A       5/2003
(Continued)

OTHER PUBLICATIONS

Bluetooth, "Specification of the Bluetooth System, Core System Package, (Controller Volume)", Version 1.2, Nov. 5, 2003, Specification vol. 2, pp. 97-132.

(Continued)

*Primary Examiner* — Melody Mehrpour
(74) *Attorney, Agent, or Firm* — McAndrews, Held & Malloy, Ltd.

(57) ABSTRACT

In RF transceivers, a method and a system for a frequency feedback adjustment in digital receivers are provided. A DC offset may result from the difference in frequencies between an RF transmitter and an RF receiver. An adjustment of the receiver's frequency may be implemented after synchronization occurs and may be performed by, for example, utilizing a header portion of a packet communicated via a wireless interface. The adjustment may be performed when the frequency difference exceeds a threshold value. In another aspect, adjusting the frequency of the RF receiver may be performed by modifying and/or changing a phase locked loop (PLL) trimmer register. This approach may allow an RF receiver to operate, in some instances, without the need for an equalizer. In this regard, the power consumed by the RF receiver may be minimized and/or the overall cost of the RF receiver may be reduced.

20 Claims, 14 Drawing Sheets

U.S. PATENT DOCUMENTS

| | | | |
|---|---|---|---|
| 5,001,724 | A | 3/1991 | Birgenheier et al. |
| 5,365,187 | A | 11/1994 | Hornak et al. |
| 5,499,393 | A * | 3/1996 | Fukui ............................ 455/264 |
| 5,559,841 | A | 9/1996 | Pandula |
| 5,699,386 | A | 12/1997 | Measor et al. |
| 5,930,307 | A | 7/1999 | Deluca |
| 5,940,744 | A * | 8/1999 | Uda ................................ 455/75 |
| 6,104,238 | A | 8/2000 | Mattisson et al. |
| 6,314,278 | B1 | 11/2001 | Zamat |
| 6,498,929 | B1 * | 12/2002 | Tsurumi et al. ............... 455/296 |
| 6,577,229 | B1 | 6/2003 | Bonneau et al. |
| 6,600,378 | B1 * | 7/2003 | Patana ........................... 331/1 A |
| 6,643,336 | B1 | 11/2003 | Hsieh et al. |
| 6,690,740 | B1 | 2/2004 | Mattisson et al. |
| 6,694,131 | B1 * | 2/2004 | Lakkis ........................... 455/302 |
| 6,728,277 | B1 | 4/2004 | Wilson |
| 6,819,910 | B2 * | 11/2004 | Shi et al. ....................... 455/126 |
| 6,850,745 | B2 * | 2/2005 | Anand et al. ................... 455/260 |
| 6,851,493 | B2 | 2/2005 | Staszewski et al. |
| 6,891,440 | B2 * | 5/2005 | Straub et al. .................. 331/1 R |
| 6,931,051 | B2 | 8/2005 | Nafie et al. |
| 6,947,495 | B2 | 9/2005 | Ezquerra-Moreu et al. |
| 6,999,744 | B2 * | 2/2006 | Kim ................................ 455/310 |
| 7,079,595 | B2 * | 7/2006 | Jensen et al. ................... 375/319 |
| 7,110,469 | B2 * | 9/2006 | Shi et al. ....................... 375/295 |
| 7,116,729 | B2 * | 10/2006 | Ibrahim et al. ................ 375/324 |
| 7,164,329 | B2 * | 1/2007 | Toncich et al. ............... 333/139 |
| 7,190,740 | B2 | 3/2007 | Chu et al. |
| 7,382,200 | B2 | 6/2008 | Staszewski et al. |
| 7,599,662 | B2 * | 10/2009 | Ibrahim et al. ............... 455/41.2 |
| 7,684,519 | B2 | 3/2010 | Kim et al. |
| 2001/0053176 | A1 * | 12/2001 | Fry et al. ....................... 375/133 |
| 2002/0094052 | A1 | 7/2002 | Staszewski et al. |
| 2002/0114303 | A1 | 8/2002 | Crosbie et al. |
| 2002/0116460 | A1 | 8/2002 | Treister et al. |
| 2002/0136268 | A1 | 9/2002 | Gan et al. |
| 2002/0160738 | A1 * | 10/2002 | Allott et al. ................... 455/304 |
| 2003/0058964 | A1 | 3/2003 | Ezquerra-Moreu et al. |
| 2003/0076901 | A1 | 4/2003 | Yuan et al. |
| 2003/0078037 | A1 * | 4/2003 | Auckland et al. ............. 455/422 |
| 2003/0091127 | A1 | 5/2003 | Jensen et al. |
| 2003/0161413 | A1 | 8/2003 | Jensen et al. |
| 2003/0194984 | A1 * | 10/2003 | Toncich et al. ............... 455/323 |
| 2003/0197810 | A1 * | 10/2003 | Jaffe ............................... 348/726 |
| 2003/0202619 | A1 * | 10/2003 | Ibrahim et al. ................ 375/319 |
| 2003/0203728 | A1 * | 10/2003 | Filipovic ..................... 455/234.2 |
| 2004/0073127 | A1 | 4/2004 | Istvan et al. |
| 2004/0081256 | A1 * | 4/2004 | Shi et al. ........................ 375/317 |
| 2004/0146122 | A1 | 7/2004 | Fague et al. |
| 2004/0179429 | A1 | 9/2004 | Preston |
| 2005/0009491 | A1 * | 1/2005 | Anand et al. ................... 455/258 |
| 2005/0031055 | A1 | 2/2005 | Ernst |
| 2005/0043001 | A9 * | 2/2005 | Toncich et al. ............... 455/323 |
| 2005/0164639 | A1 * | 7/2005 | Suissa et al. .................. 455/63.1 |
| 2005/0186933 | A1 | 8/2005 | Trans |
| 2005/0197064 | A1 | 9/2005 | Ibrahim et al. |
| 2005/0250459 | A1 | 11/2005 | Tervaluoto et al. |
| 2006/0093081 | A1 | 5/2006 | Ibrahim et al. |
| 2006/0153316 | A1 | 7/2006 | Payne et al. |
| 2006/0262836 | A1 | 11/2006 | Yuan et al. |
| 2007/0216551 | A1 | 9/2007 | Yuan et al. |
| 2008/0214112 | A1 * | 9/2008 | Ibrahim et al. ............... 455/41.2 |

FOREIGN PATENT DOCUMENTS

| | | |
|---|---|---|
| EP | 1271872 | 6/2001 |
| WO | WO 03/065568 | 8/2003 |

OTHER PUBLICATIONS

Communication with European Search Report relating to Application No. EP05017631, mailed May 2, 2011, 6 pages.

* cited by examiner

Example of a Bluetooth Piconet

FM radio receiver 100

LO module 74

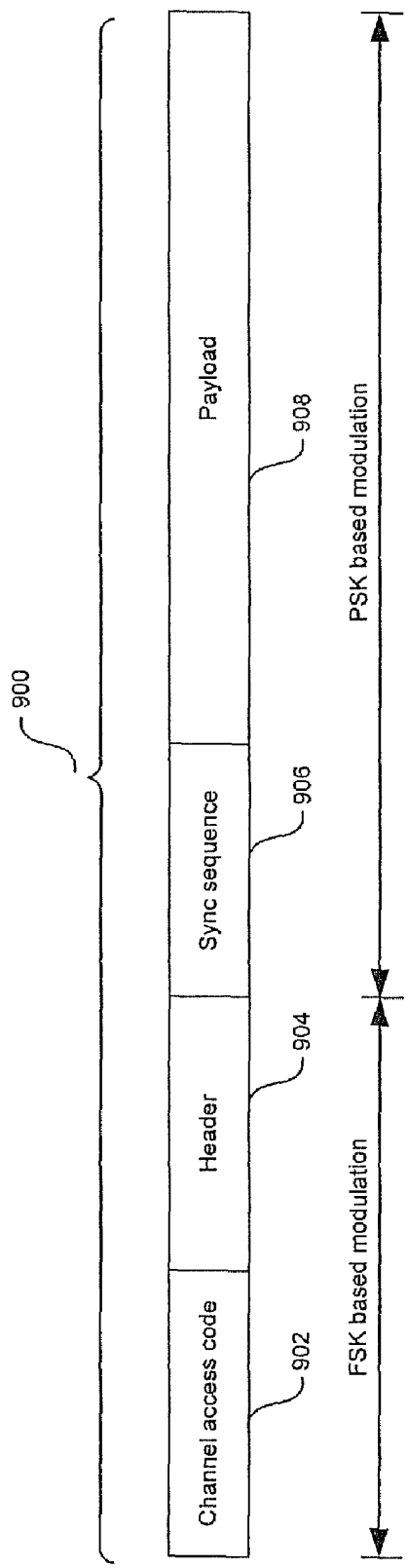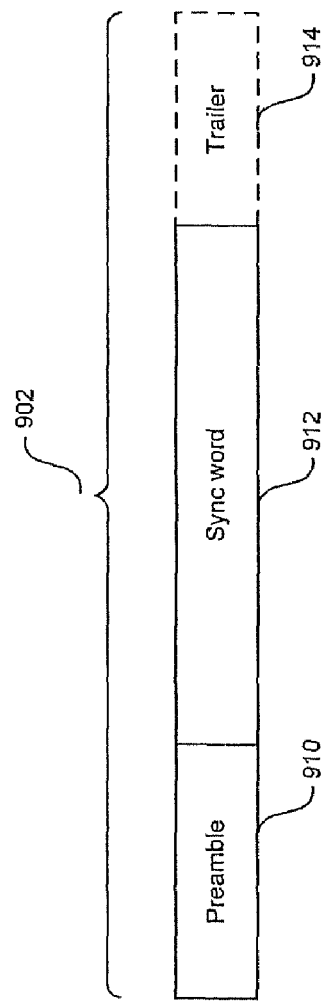
FIG. 9A
FIG. 9B

METHOD AND SYSTEM FOR FREQUENCY FEEDBACK ADJUSTMENT IN DIGITAL RECEIVERS

CROSS-REFERENCE TO RELATED APPLICATIONS/INCORPORATION BY REFERENCE

This application is a continuation of U.S. application Ser. No. 11/102,123 which was filed Apr. 8, 2005, and which in turn is a continuation-in-part of U.S. application Ser. No. 10/134,797, filed April 29, 2002.

This patent application makes reference to, claims priority to and claims benefit from U.S. Provisional Patent Application Ser. No. 60/623,963 filed on Nov. 1, 2004.

This application makes reference to:
U.S. patent application Ser. No. 11/101,961 filed Apr. 8, 2005;
U.S. patent application Ser. No. 11/101,990 filed Apr. 8, 2005; and
U.S. patent application Ser. No. 11/102,157 filed Apr. 8, 2005

The above stated applications are hereby incorporated herein by reference in their entirety.

FEDERALLY SPONSORED RESEARCH OR DEVELOPMENT

Not applicable.

MICROFICHE/COPYRIGHT REFERENCE

Not applicable.

FIELD OF THE INVENTION

Certain embodiments of the invention relate to the processing of radio signals in a radio frequency (RF) transceiver. More specifically, certain embodiments of the invention relate to a method and system for a frequency feedback adjustment in digital receivers.

BACKGROUND OF THE INVENTION

Communication systems are known to support wireless and wireline communications between wireless and/or wireline communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, for example, a cellular telephone, two-way radio, personal digital assistant (PDA), personal computer (PC), laptop computer, or home entertainment equipment, communicates directly or indirectly with other wireless communication devices. For direct communications, also known as point-to-point communications, the participating wireless communication devices tune their receivers and transmitters to the same channel, or channels, and communicate over that channel(s). Each channel may utilize one or more of the plurality of radio frequency (RF) carriers of the wireless communication system. For indirect wireless communications, each wireless communication device communicates directly with an associated base station, for example, for cellular services, and/or an associated access point, for example, for an in-home or in-building wireless network, via an assigned channel or channels. To complete a communication connection between the wireless communication devices, the associated base stations and/or associated access points communicate with each other directly, via a system controller, via a public switch telephone network, via Internet, and/or via some other wide area network.

In order for each wireless communication device to participate in wireless communication, it utilizes a built-in radio transceiver, which comprises a receiver and a transmitter, or it is coupled to an associated radio transceiver, for example, a station for in-home and/or in-building wireless communication networks, or a RF modem. The transmitter converts data into RF signals by modulating the data in accordance with the particular wireless communication standard to produce a baseband signal. The baseband signal is mixed with a local oscillator signal in one or more intermediate frequency stages to produce the RF signal. The radio receiver generally includes an antenna section, a filtering section, a low noise amplifier, an intermediate frequency (IF) stage, and a demodulator. The antenna section receives the RF signal and provides it to the filtering section, which, in turn, passes a filtered RF signal to the low noise amplifier. The low noise amplifier amplifies the filtered RF signal and provides an amplified RF signal to the IF stage. The IF stage steps down the frequency of the amplified RF signal to an intermediate frequency or to baseband. The IF stage provides the IF signal or baseband signal to the demodulator, which recaptures the data in accordance with the demodulation protocol.

For the demodulator to accurately recover data from the IF signals or the baseband signals, unwanted direct current (DC) offsets must be overcome. One source of DC offsets in the demodulated output of a frequency modulated (FM) system is when the local oscillator of a transmitting radio generates a signal with a slightly different frequency than the frequency of the signal produced by the receiving radio local oscillator. To correct for the DC offset, a demodulator in a radio receiver includes a DC offset detection circuit and DC offset compensation circuit. The DC offset detection circuit indicates the level of DC offset due to frequency mismatch. The DC compensation circuit removes the DC offset indicated by the DC offset detection circuit from the demodulated IF signals or baseband signals before data extraction. The DC offset due to frequency mismatch can adversely affect the data extracted from the IF or baseband signals.

For example, Bluetooth utilizes a 64-bit synchronization (SYNC) word, which comprises a predefined bit sequence. The 64-bit synchronization (SYNC) word is utilized for identifying devices that want to communicate with each other. Hence, devices wishing to communicate with each other must identify the 64-bit synchronization (SYNC) word via a correlation process. After successful correlation, communication may take place among the Bluetooth devices. The DC offset sometimes interferes with identifying the 64-bit synchronization (SYNC) word, and as a result, the 64-bit synchronization (SYNC) word is not correlated. As an example, if a synchronization threshold is set at 56 bits for a 64-bit synchronization (SYNC) word and the first 6 bits are misidentified due to the DC offset and there are three other bit errors in the remainder of the 64-bit synchronization (SYNC) word, then the synchronization pattern will be missed.

The presence of the DC offset may require the use of circuitry in order to compensate for the frequency difference. This compensation circuitry may require additional area in an integrated circuit (IC) and/or may require additional power during receiver operation.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a frequency feedback adjustment in digital receivers, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 9A illustrates an exemplary Bluetooth packet structure, which may be utilized in connection with an embodiment of the present invention.

FIG. 9B illustrates an exemplary channel access code portion of a Bluetooth packet structure, which may be utilized in connection with an embodiment of the present invention.

DETAILED DESCRIPTION OF THE INVENTION

Figure 1A:
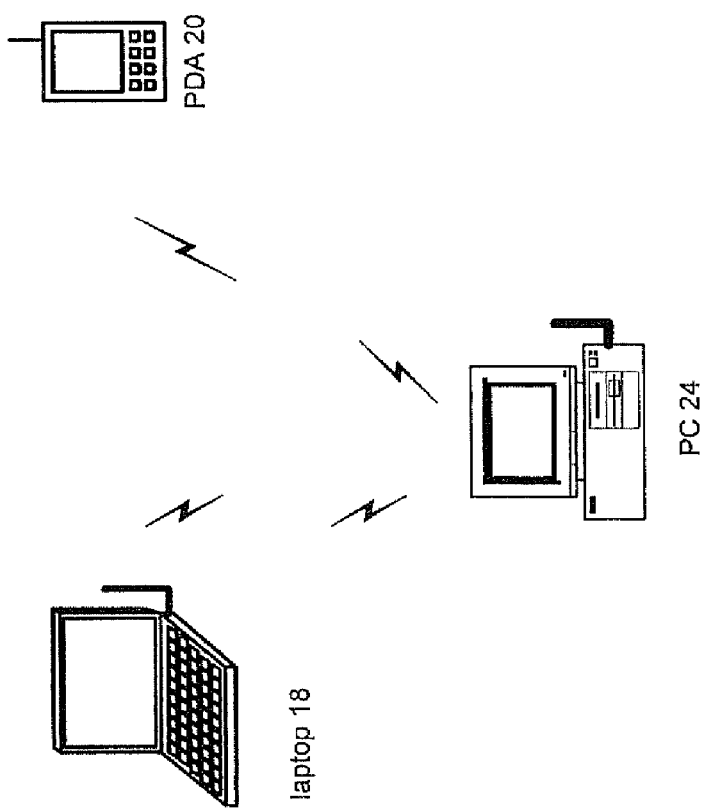
FIG. 1A illustrates a Bluetooth piconet that may be utilized in connection with an embodiment of the invention.

Certain embodiments of the invention may be found in a method and system for a frequency feedback adjustment in digital receivers. One aspect of the invention provides for adjusting a local oscillator frequency in a radio frequency (RF) receiver when a DC offset is present. The DC offset may be a result of the difference in frequencies between a transmitter and the RF receiver. The adjustment may be implemented after synchronization occurs and may be performed by utilizing the Forward Error Correction (FEC) repetition rate in a header of a Bluetooth packet structure. The adjustment may be performed when the difference between a transmitter frequency and a receiver frequency exceeds a threshold value. In another aspect, adjusting the frequency of the RF receiver may be performed by modifying and/or changing a phase locked loop (PLL) trimmer register. This approach may allow an RF receiver to operate, in some instances, without the need for an equalizer. In this regard, the power consumed by the RF receiver may be minimized and/or the overall cost of the RF receiver may be reduced.

A radio receiver having DC offset compensation may comprise a low noise amplifier, a down conversion mixing module, a local oscillator module, a bandpass filter, a demodulation module, and a DC offset estimation module. The low noise amplifier may be operably coupled to amplify a radio frequency (RF) signal to produce an amplified RF signal. The down conversion mixing module may be operably coupled to mix a local oscillator signal, which is generated, from the local oscillator module with the amplified RF signal to produce a low intermediate frequency (IF) signal, which may have a carrier frequency of zero to several megahertz. The bandpass filter may be operably coupled to filter the low IF signal to produce a filtered signal. The demodulation module may be operably coupled to demodulate the low IF signal to produce demodulated data or recaptured data.

The local oscillator module may generate the local oscillator signal based on a reference signal and a DC offset correction signal. The DC offset estimation module may generate the DC offset correction signal based on a determined DC offset. The DC offset estimation module may determine the DC offset prior to compensation of the local oscillator, such as during a test sequence and/or during a preamble. The local oscillator initially may produce the local oscillator signal based on the reference signal and, once the DC offset correction signal has been determined, the local oscillator signal may be adjusted utilizing the determined DC offset. As adjusted, the receiver local oscillator signal frequency may substantially match the local oscillator signal frequency of the transmitter. This essentially eliminates the DC offset in the receiver due to frequency mismatch, and the adverse affects associated therewith.

The direct DC offset compensation may also be utilized in a self-correcting clocking module, which may be used in a data recovery circuit. The self-correcting clocking module may compare a reference signal source, a phase and frequency detection module, a charge pump module, a low pass filter, a voltage controlled oscillator (VCO), and a programmable feedback module. The phase and frequency detection module may produce a difference signal based on a phase and/or frequency difference between the reference signal and a feedback signal. The charge pump may produce a charge-up or charge-down signal from the difference signal, which may be subsequently filtered by the low pass filter. The VCO may produce a recovery clock, or local oscillator signal, whose frequency may change based on the filtered charge-up or charge-down signal.

The programmable feedback module may be operably coupled to produce the feedback signal by dividing the recovery clock by a divider value. The programmable feedback module may generate the divided value in accordance with a predetermined clock value and a fractional adjustment value that is based on the DC offset of recovered data. The predetermined clock value may be a ratio between the reference signal and the desired frequency of the recovery clock or the local oscillator signal. Accordingly, radio receivers and other types of data recovery circuits may reduce adverse affects caused by DC offsets by incorporating the teachings of the present invention.

FIG. 1A illustrates a Bluetooth piconet that may be utilized in connection with an embodiment of the invention. Referring to FIG. 1A, there is shown a laptop 18, a personal digital assistant (PDA) 20, and a personal computer (PC) 24. These three devices may have Bluetooth compliant communication cards, and therefore may be able to communicate using Bluetooth protocol. One Bluetooth device in a piconet may be designated as a master and others as slaves. The designation process may be a dynamic process each time a piconet is set up. A device may be designated as a master device for one piconet, and a slave device for another piconet. The designation may be based on an algorithm that takes in to account performance and power requirements of the piconet and the various devices.

Once a device is designated as a master device, the master Bluetooth device, for example, the laptop 18, may broadcast a query to see if there are any slave devices within an address range to which it may belong. Various devices may fall in to a specific address range determined by a consortium of Bluetooth manufacturers. All devices in the same address range may be a part of a piconet that may be limited to a maximum range of, for example, 10 meters. The Bluetooth standard allows three different ranges of 10 meters, 20 meters and 100 meters. Although only a single piconet is illustrated, in a system comprising a plurality of piconets, it is possible for a device to operate as a master in one piconet and as a slave in an adjacent piconet. For example, a Bluetooth device A may operate as a master in a first piconet $P_1$ and as a slave in a second piconet $P_2$. In another example, the Bluetooth device A may operate as a slave in a first piconet $P_1$ and as a master in a second piconet $P_2$.

PCs, PDAs and laptops may share the same address range. Similarly, cordless phone bases and cordless handsets may share another address range. Additionally, cell phones and car speaker kits may share yet another address range. When a master Bluetooth device, for example, the laptop 18, receives replies from slave devices, for example, the PC 24 and the PDA 20, the master may communicate with each of the slave devices. However, the slave devices may not talk directly with each other. When the master device moves out of range of communication, the piconet may be destroyed until another device can be designated as a master device.

Figure 1B:
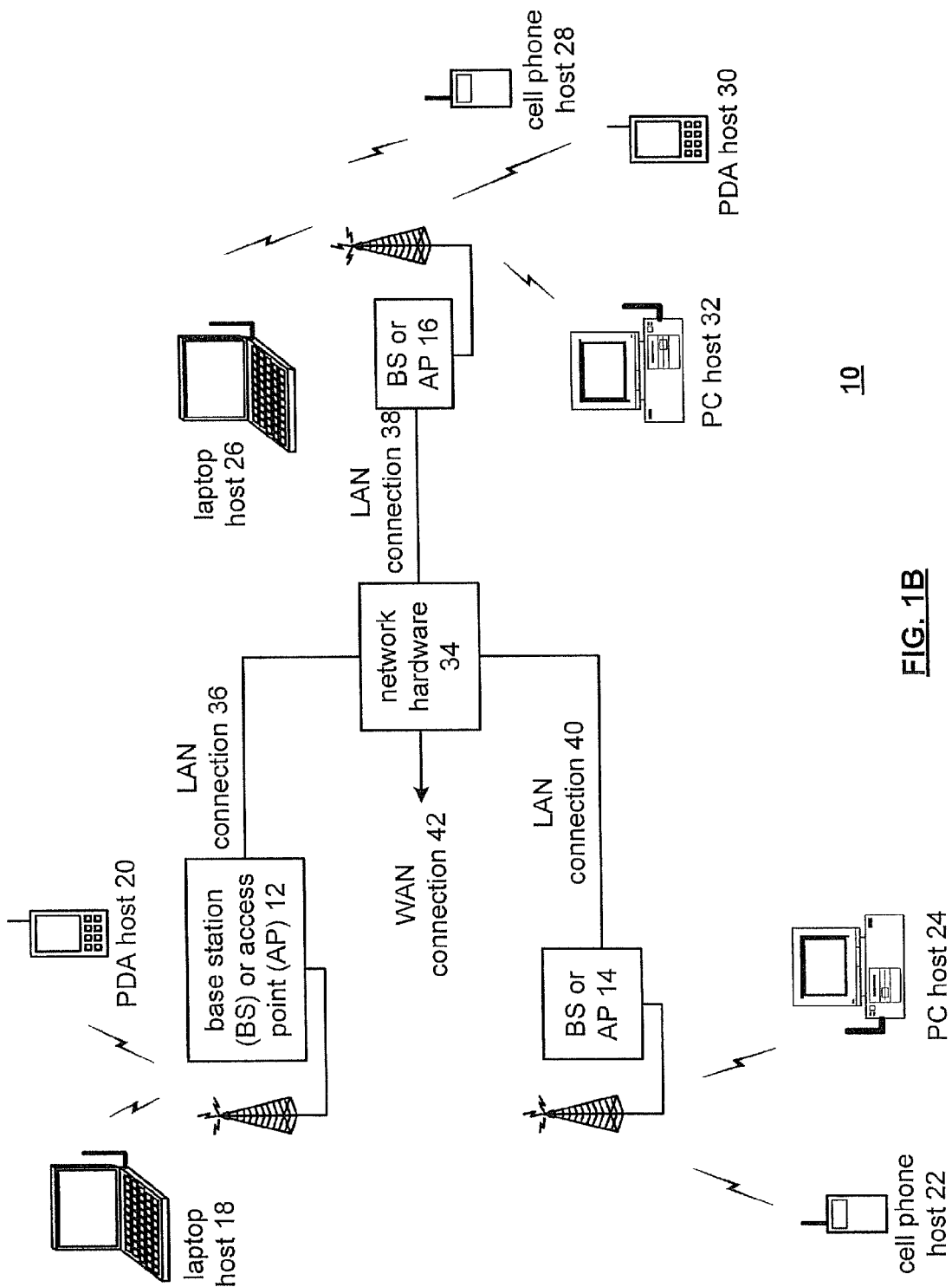
FIG. 1B illustrates a block diagram of a wireless communication system in accordance with an embodiment of the present invention.

FIG. 1B illustrates a block diagram of a wireless communication system in accordance with an embodiment of the present invention. Referring to FIG. 1B, there is shown a block diagram of a communication system 10 that comprises a plurality of base stations and/or access points 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIG. 2.

The base stations or access points 12-16 may be operably coupled to the network hardware 34, for example, via local area network connections 36, 38 and 40. The network hardware 34, for example, a router, switch, bridge, modem, or system controller, may provide a wide area network connection 42 for the communication system 10. Each of the base stations or access points 12-16 may have an associated antenna or antenna array to communicate with the wireless communication devices in its area. Typically, the wireless communication devices may register with a particular base station or access point 12-16 to receive services from the communication system 10. For direct connections, for example, point-to-point communications, wireless communication devices may communicate directly via an allocated channel.

Typically, base stations are used for cellular telephone systems and similar type of systems, while access points are used for in-home or in-building wireless networks, although those terms are often used interchangeably. Regardless of the particular type of communication system, each wireless communication device includes a built-in radio and/or is coupled to a radio. The radio may be adapted to utilize DC offset compensation as disclosed herein to enhance performance of radio receivers, including receivers within radio frequency integrated circuits.

Figure 2:
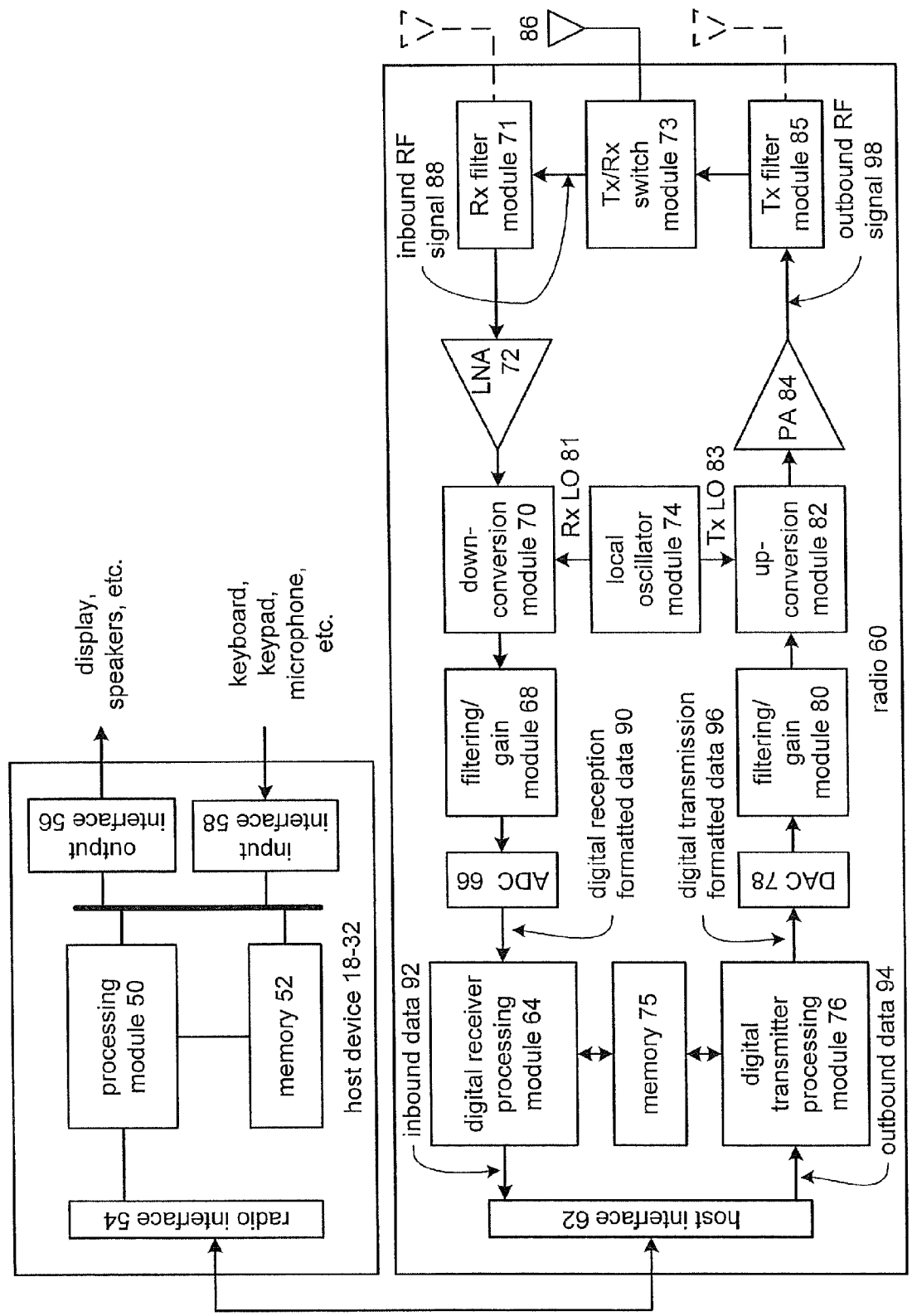
FIG. 2 illustrates a block diagram of a wireless communication device in accordance with an embodiment of the present invention.

FIG. 2 illustrates a block diagram of a wireless communication device, in accordance with an embodiment of the invention. Referring to FIG. 2, there is shown the devices 18-32 and an associated radio 60. For cellular telephones, the radio 60 may be an integrated or a built-in component. For personal digital assistants (PDAs), laptops, and/or personal computers, the radio 60 may be a built-in or an externally coupled component. For example, the radio may be a plug-in card that may be coupled via a USB interface or other suitable interface As illustrated, the device 18-32 may include a processing module 50, a memory 52, a radio interface 54, an output interface 56 and an input interface 58. The processing module 50 and the memory 52 may execute corresponding instructions that may be typically executed by a device. For example, for a cellular telephone device, the processing module 50 may perform the corresponding communication functions in accordance with a particular cellular telephone standard.

The radio interface 54 may be adapted to allow data to be received from and sent to the radio 60. For data received from the radio 60, for example, inbound data, the radio interface 54 may provide the data to the processing module 50 for further processing and/or routing to the output interface 56. The output interface 56 may provide connectivity to an output display device, for example, a display, a monitor, or speakers, such that the received data may be output. The radio interface 54 also provides outbound data from the processing module 50 to the radio 60. The processing module 50 may receive the outbound data from an input device, for example, a keyboard, a keypad, or a microphone, via the input interface 58. The processing module 50 may generate the data itself. For data received via the input interface 58, the processing module 50 may perform a corresponding function on the data and/or route it to the radio 60 via the radio interface 54.

Radio 60 may comprise an interface 62, a receiver section, a transmitter section, local oscillator module 74, an antenna switch 73, and an antenna 86. The receiver section may comprise a digital receiver processing module 64, analog-to-digital converter 66, filtering/gain module 68, down conversion module 70, receiver filter module 71, low noise amplifier 72, and at least a portion of memory 75. The transmitter section may include a digital transmitter processing module 76, a digital-to-analog converter 78, a filtering/gain module 80, an up-conversion module 82, a power amplifier 84, a transmitter filter module 85, and at least a portion of memory 75. The antenna 86 may be a single antenna that is shared by both the transmit and receive paths via the antenna switch 73. Alternatively, there may be separate antennas for the transmit path and receive path and antenna switch 73 may be omitted. The antenna implementation may depend on the particular standard to which the wireless communication device is compliant.

The digital receiver processing module 64 and the digital transmitter processing module 76, in combination with operational instructions stored in memory 75, may execute digital receiver functions and digital transmitter functions, respectively. The digital receiver functions may include, but are not limited to, digital intermediate frequency to baseband conversion, demodulation, constellation demapping, decoding, and/or descrambling. Another digital receiver function may be estimating DC offsets. The digital transmitter functions may include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor (DSP), microcomputer, central processing unit, field programmable gate array (FPGA), application specific integrated circuit (ASIC), programmable logic device (PLD), state machine, logic circuitry, analog circuitry, digital circuitry, and/or any device that manipulates analog and/or digital signals based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that if the processing module 64 and/or 76 implements one or more of its functions via a state machine, analog circuitry, digital circuitry, and/or logic circuitry, the memory storing the corresponding operational instructions may be embedded with the circuitry comprising the state machine, analog circuitry, digital circuitry, and/or logic circuitry.

In operation, the radio 60 may be adapted to receive outbound data 94 from the device via the interface 62. The interface 62 routes the outbound data 94 to the digital transmitter processing module 76, which processes the outbound data 94 in accordance with a particular wireless communication standard, for example, IEEE 802.11a, IEEE 802.11b, or Bluetooth, to produce a digital transmission formatted data 96. The digital transmission formatted data 96 may be a digital baseband signal or a digital low IF signal whose modulation frequency may be in the range of zero hertz to a few megahertz.

The digital-to-analog converter 78 may be adapted to convert the digital transmission formatted data 96 from digital domain to analog domain. The filtering/gain module 80 may filter and/or adjust the gain of the analog signal prior to providing it to the up-conversion module 82. The up-conversion module 82 may directly convert the analog baseband or low IF signal into an RF signal based on a transmitter local oscillator signal provided by local oscillator module 74, which may be implemented in accordance with the teachings of the present invention. The power amplifier 84 may amplify the RF signal to produce an outbound RF signal 98, which may be subsequently filtered by the transmitter filter module 85. The antenna 86 may transmit the outbound RF signal 98 to a targeted device such as a base station, an access point and/or another wireless communication device.

The radio 60 may receive an inbound RF signal 88 via the antenna 86 that was transmitted by a base station, an access point, or another wireless communication device. The antenna 86 may provide the inbound RF signal 88 to the receiver filter module 71, which may filter the inbound RF signal 88 and provide a filtered RF signal to the low noise amplifier 72. The low noise amplifier 72 may amplify the filtered RF signal and provide an amplified inbound RF signal to the down conversion module 70, which may directly convert the amplified inbound RF signal into an inbound low IF signal. This may be done utilizing the receiver's local oscillator signal provided by the local oscillator module 74, which may be implemented in accordance with the teachings of the present invention. The down conversion module 70 may provide the inbound low IF signal to the filtering/gain module 68, which may filter and/or adjust the gain of the signal before providing it to the analog to digital converter 66.

The analog-to-digital converter 66 may convert the filtered inbound low IF signal from the analog domain to the digital domain to produce digital reception formatted data 90. The digital receiver processing module 64 may decode, descramble, demap, and/or demodulate the digital reception formatted data 90 to recapture inbound data 92 in accordance with the particular wireless communication standard being implemented by radio 60. The interface 62 may provide the recaptured inbound data 92 to the devices 18-32 via the radio interface 54.

The radio may be implemented in a variety of ways to receive RF signals and to transmit RF signals, and may be implemented using a single integrated circuit or multiple integrated circuits. Further, at least some of the modules of the radio 60 may be implemented on the same integrated circuit with at least some of the modules of the devices 18-32. Regardless of how the radio is implemented, the concepts of the present invention are applicable.

Figure 3:
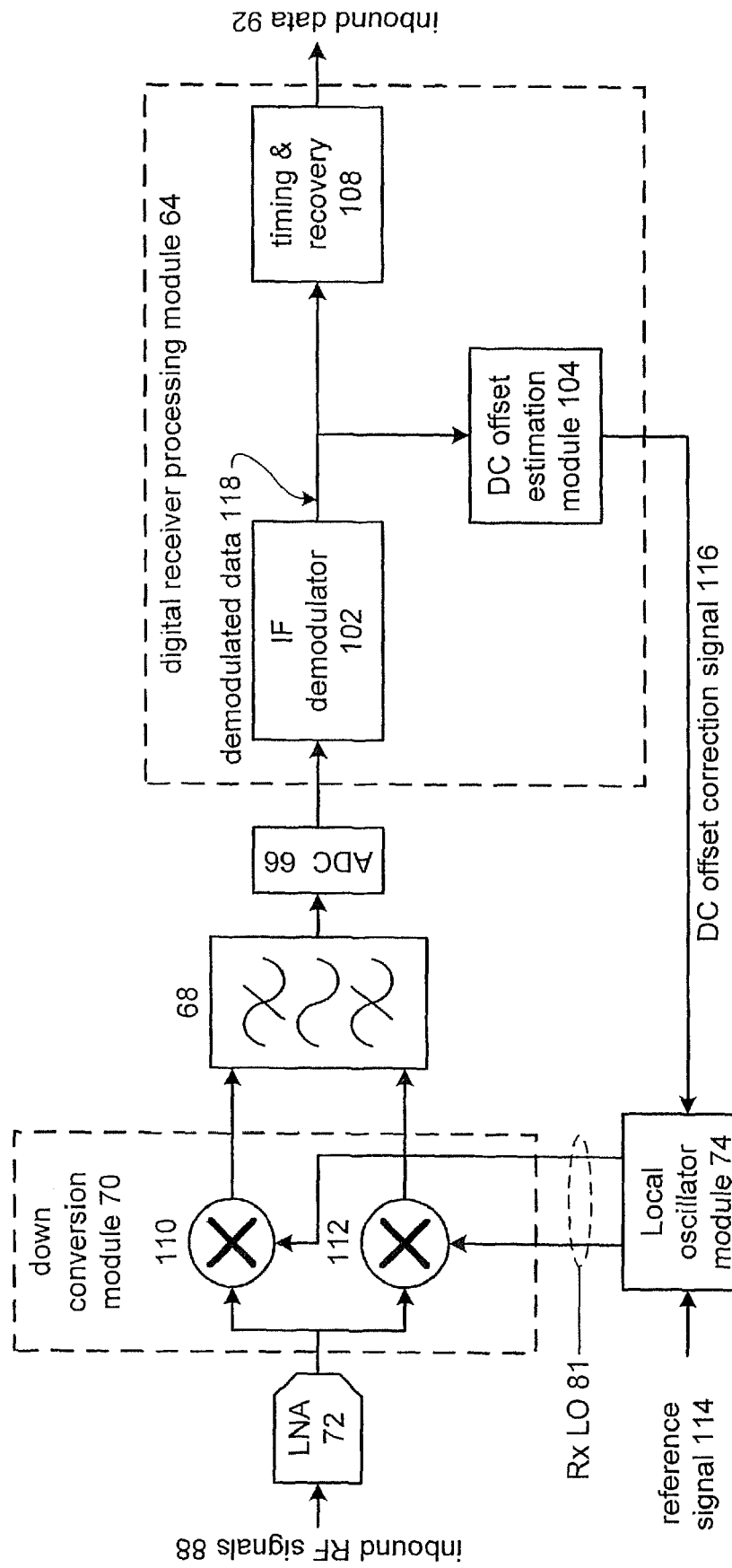
FIG. 3 illustrates a block diagram of a radio receiver in accordance with an embodiment of the present invention.

FIG. 3 illustrates a block diagram of a radio receiver, in accordance with an embodiment of the invention. Referring to FIG. 3, there is shown a radio receiver 100 that may be utilized in the wireless communication device of FIG. 2. The radio receiver 100 may include the low noise amplifier 72, down conversion module 70, a bandpass filter for the filtering gain module 68, the analog to digital converter 66, the local oscillator module 74, and the digital receiver processing module 64. In this implementation, the digital receiver processing module 64 may be configured to function as an IF demodulator 102, a DC offset estimation module 104, and a timing and recovery module 108. The down conversion module 70 may include a 1st mixer 110 and a 2nd mixer 112.

In operation, the low noise amplifier 72 may receive and filter inbound RF signals 88, which may have been produced by mixing baseband signals with a local oscillator signal within a transmitting radio. The filtered signals may be provided to the 1st and 2nd mixers 110 and 112 of the down conversion module 70. The 1st mixer 110 may mix an in-phase component of the RF signals 88 with an in-phase component of the receiver's local oscillator signal 81. The 2nd mixer 112 may mix a quadrature component of the RF signals 88 with a quadrature component of the receiver's local oscillator signal 81. Initially, the receiver's local oscillator signal 81 may be generated solely based on the reference signal 114. As such, the frequency of the receiver's local oscillator signal 81 may not match the frequency of the local oscillator signal of the transmitting radio that transmitted the RF signals 88. As such, a DC offset may initially result.

The bandpass filter 68 may filter the mixed signals produced by the down-conversion module 70 and provide a low IF signal to the analog to digital converter 66. The analog to digital converter 66 may convert the low IF analog signals to low IF digital signals.

The IF demodulator 102 may receive the digital IF signals, and demodulate them via the IF demodulator 102 to produce demodulated data 118. The DC offset estimation module 104 may interpret the demodulated data 118 to determine a DC offset value. The determined DC offset value may be used to generate a DC offset correction signal 116, which may be fed back to the local oscillator module 74. The DC offset estimation module 104 may determine the specific value that the local oscillator module is to be adjusted by and such information may be contained within the DC offset correction signal 116. Alternatively, the DC offset correction signal 116 may include an indication of the value of the DC offset, such that the local oscillator module 74 may process the DC offset to determine the amount of local oscillator adjustment needed.

The timing and recovery module 108 may receive the demodulated data 118 and produce therefrom, inbound data 92. Initially, prior to direct DC offset compensation, the inbound data 92 may include errors. As such, it may be desirable to generate the DC offset correction signal 116 and modify the receiver's local oscillator signal 81 as soon as possible so that the inbound data 92 may be corrected as quickly as possible. For instance, it may be desirable to determine the DC offset correction signal 116 during a training sequence of the radio receiver or during the initial phases of receiving a preamble of a signal.

Figure 4:
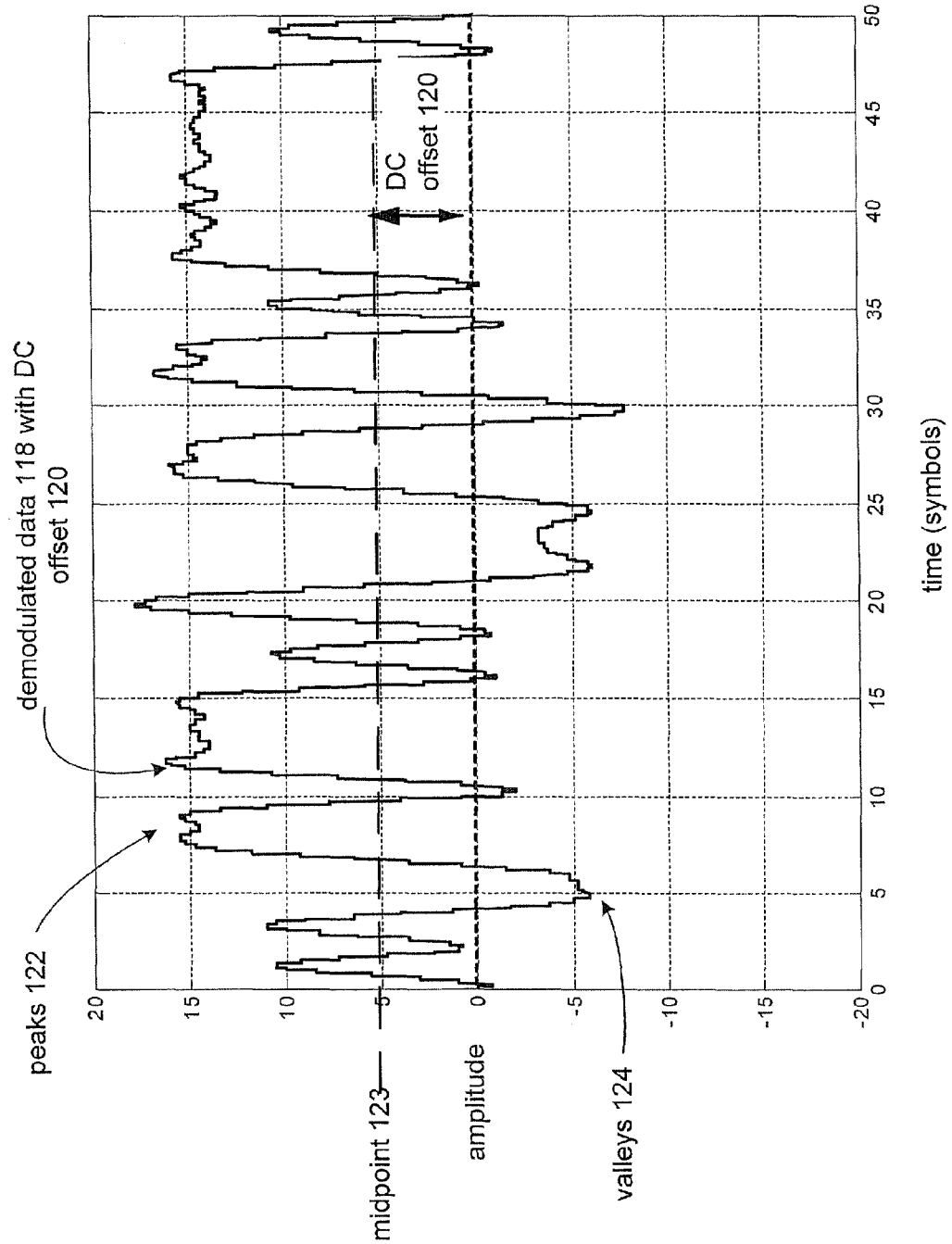
FIG. 4 illustrates a graphical representation of typical demodulated data without DC offset correction, in accordance with an embodiment of the present invention.

FIG. 4 illustrates a graphical representation of typical demodulated data without DC offset correction, which may be utilized in connection with an embodiment of the invention. Referring to FIG. 4, there is shown the demodulated data 118 with the DC offset. Peaks and valleys 122 and 124 of the demodulated data are identified. The DC offset estimation module 104 may use the peaks and valleys to determine a midpoint 123 between an average peak value and an average valley value. The DC offset estimation module 104 may compare the midpoint 123 to zero amplitude and determine the DC offset 120 to be a difference between the midpoint 123 and the zero amplitude.

Figure 5:
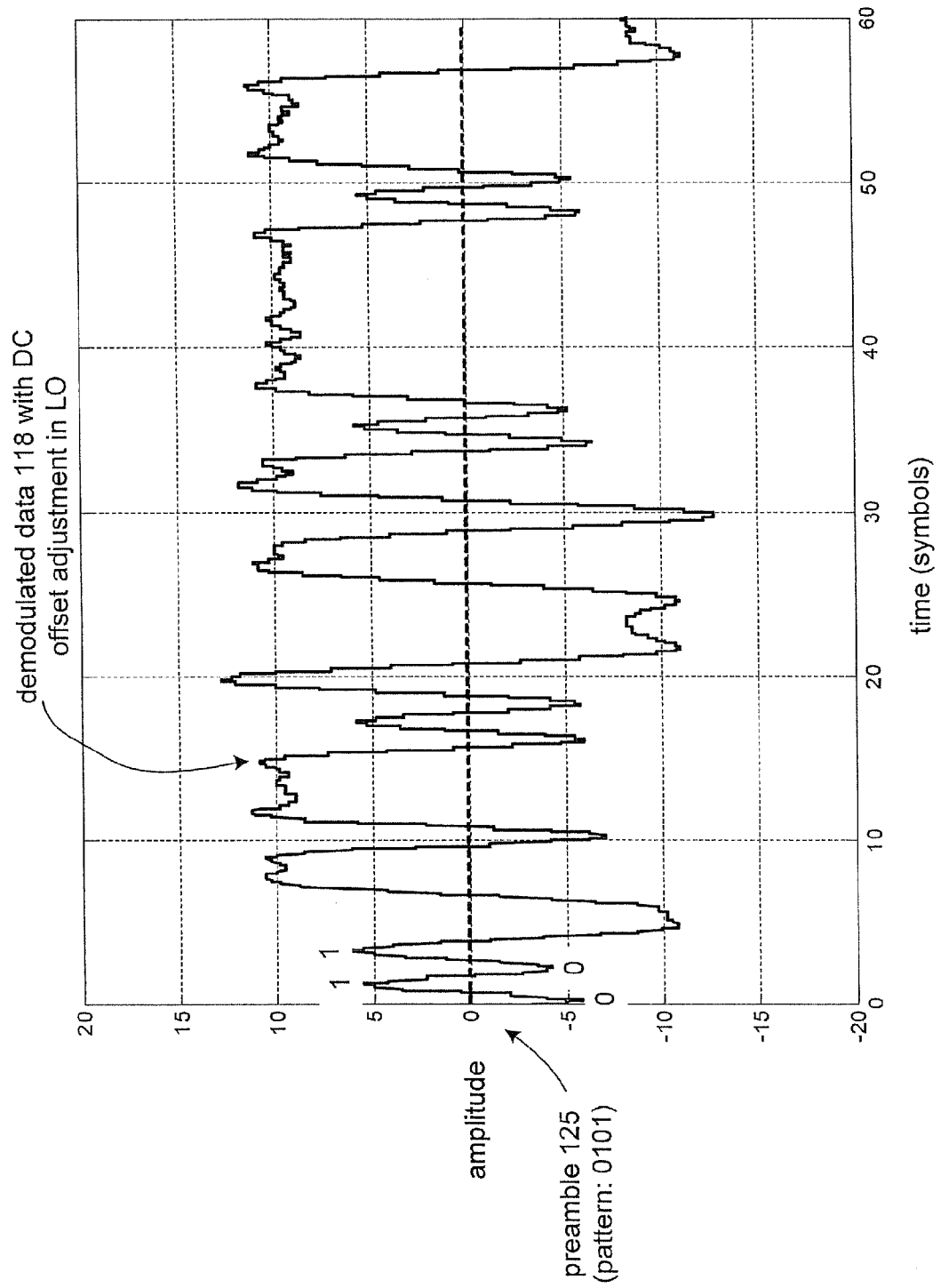
FIG. 5 illustrates a graphical representation of typical demodulated data with DC offset correction in accordance with an embodiment of the present invention.

FIG. 5 illustrates a graphical representation of typical demodulated data with DC offset correction, in accordance with an embodiment of the invention. Referring to FIG. 5, there is shown the demodulated data 118 that is produced after the local oscillator is adjusted in accordance with the DC offset correction signal 116. In this particular example, a beginning of the demodulated data 118 includes a preamble 125, which has a particular pattern. In this example, the pattern is 0101. As such, it may be desirable to generate the DC offset correction signal 116 during this preamble phase so that the receiver's local oscillator signal 81 may be adjusted to better match the local oscillator signal of the transmitting radio in order to avoid creating the DC offset.

Figure 6:
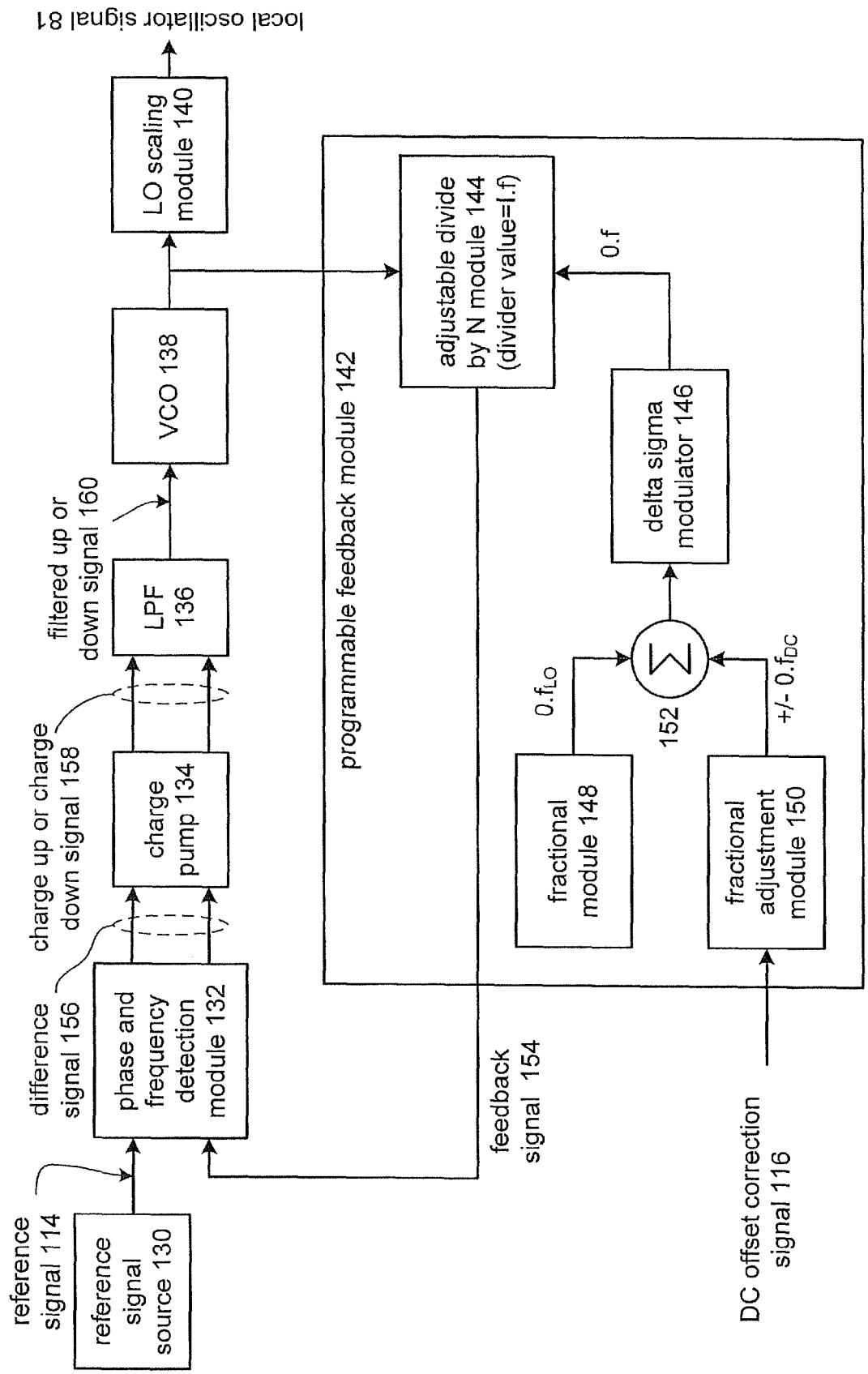
FIG. 6 illustrates a block diagram of a local oscillator module in accordance with an embodiment of the present invention.

FIG. 6 illustrates a block diagram of a local oscillator module, in accordance with an embodiment of the invention. Referring to FIG. 6, there is shown the local oscillator module 74 and/or a self-correcting clock circuit that may be utilized in data recovery circuits. The local oscillator module 74 may include a reference signal source 130, a phase and frequency detection module 132, a charge pump 134, a low pass filter 136, a voltage controlled oscillator (VCO) 138, a local oscillator scaling module 140, which may be optional, and a programmable feedback module 142. The programmable feedback module 142 may include an adjustable divide by N-module 144, a Delta Sigma modulator 146, a fractional module 148, a fractional adjustment module 150, and a summing module 152.

The reference signal source 130 may be adapted to produce a reference signal 114. The phase and frequency detection module 132 may compare the reference signal 114 with a feedback signal 154 to produce a difference signal 156. The charge pump 134 may convert the difference signal into a charge-up signal or a charge-down signal 158. The low pass filter 136 may filter the charge-up or charge-down signal to produce a filtered-up or down signal 160. The VCO 138 may generate an output signal in accordance with the filtered-up or filtered-down signal 160. The output signal may be provided to the programmable feedback module 142 and may also be provided to a local oscillator scaling module 140. If the local oscillator module 74 does not include the local oscillator scaling module 140, the output of the VCO is the receiver's local oscillator signal 81. Otherwise, the output of the local oscillator scaling module 140 may be the receiver's local oscillator signal 81.

The local oscillator scaling module 140 may be constructed in such a way that the output signal produced by the VCO 138 may have a frequency approximately ⅔ that of the receiver's local oscillator signal 81. As such, the scaling module 140 may divide the frequency of the output signal from the VCO 138 by two and then multiply the frequency of the resulting signal by three to produce the receiver's local oscillator signal 81.

The adjustable divide by N-module 144 may divide the output signal of the VCO 138 by a divider value. The divider value may include an integer portion, represented by I, and a fractional portion, represented by f. The fractional portion 0.f, may be produced by a combination of the fractional portion, $0.f_{LO}$, stored in the fractional module 148 and a fractional adjustment portion, $0.f_{DC}$, which may be produced by the fractional adjustment module 150. The fractional value, $0.f_{LO}$, may correspond to the desired fractional portion of the divider value. For example, assume that the desired output signal frequency of the VCO 138 is 1 gigahertz and the reference signal frequency is 15 megahertz. As such, the divider value, a predetermined local oscillator value, for this example is 66.667. As such, the integer portion of the divider value for this example is 66 and the fractional value is 0.667. If, however, the local oscillator of the transmitting radio, which produced the received RF signals, has a VCO output signal frequency of 1.002 gigahertz, the receiver will have a DC offset.

Accordingly, to remove the DC offset, the fractional adjustment module 150 may generate a fractional adjustment value based on the DC offset correction signal 116 to adjust the receiver's local oscillator signal 81 such that it substantially matches the local oscillator signal of the transmitting radio. For this example, the divider value to result in a 1.002 gigahertz output from VCO 138 is 66.800. Since the fractional module 148 may be providing a fractional value of 0.667, the fractional adjustment module 150 may need to produce a fractional value of 0.133. This value may result from subtracting 0.667 from 0.800. The summing module 152 may sum the fractional portion produced by the fractional module 148 and the fractional adjustment value produced by the fractional adjustment module 150. The summed fractional portion may be processed by the Sigma Delta modulator 146 to produce the resultant fractional value, $0.f_{LO}$, which may adjust the divider value of the adjustable divide by N-module 144 accordingly.

The fractional adjustment module 150 may be a lookup table that includes a plurality of fractional adjustment values that are indexed by the DC offset correction signal. The indexed fractional adjustment value may then be stored in a register, which is provided to summing module 152. Alternatively, the fractional adjustment module 150 may include processing that determines the fractional adjustment value from the DC offset correction signal 116 to produce the desired fractional adjustment value. As a further alternative, the DC offset estimation module 104 (FIG. 3) may determine the fractional adjustment value such that the fractional adjustment module 150 may include a register for storing the fractional adjustment value. Regardless of the particular method for determining the fractional adjustment value, the DC offset may be corrected by adjusting the frequency of the local oscillator signal of the receiver to substantially match the frequency of the local oscillator signal of the radio that transmitted the RF signals. As such, radio receivers may have negligible DC offset, thus reducing any potential errors associated with DC offsets.

Figure 7:
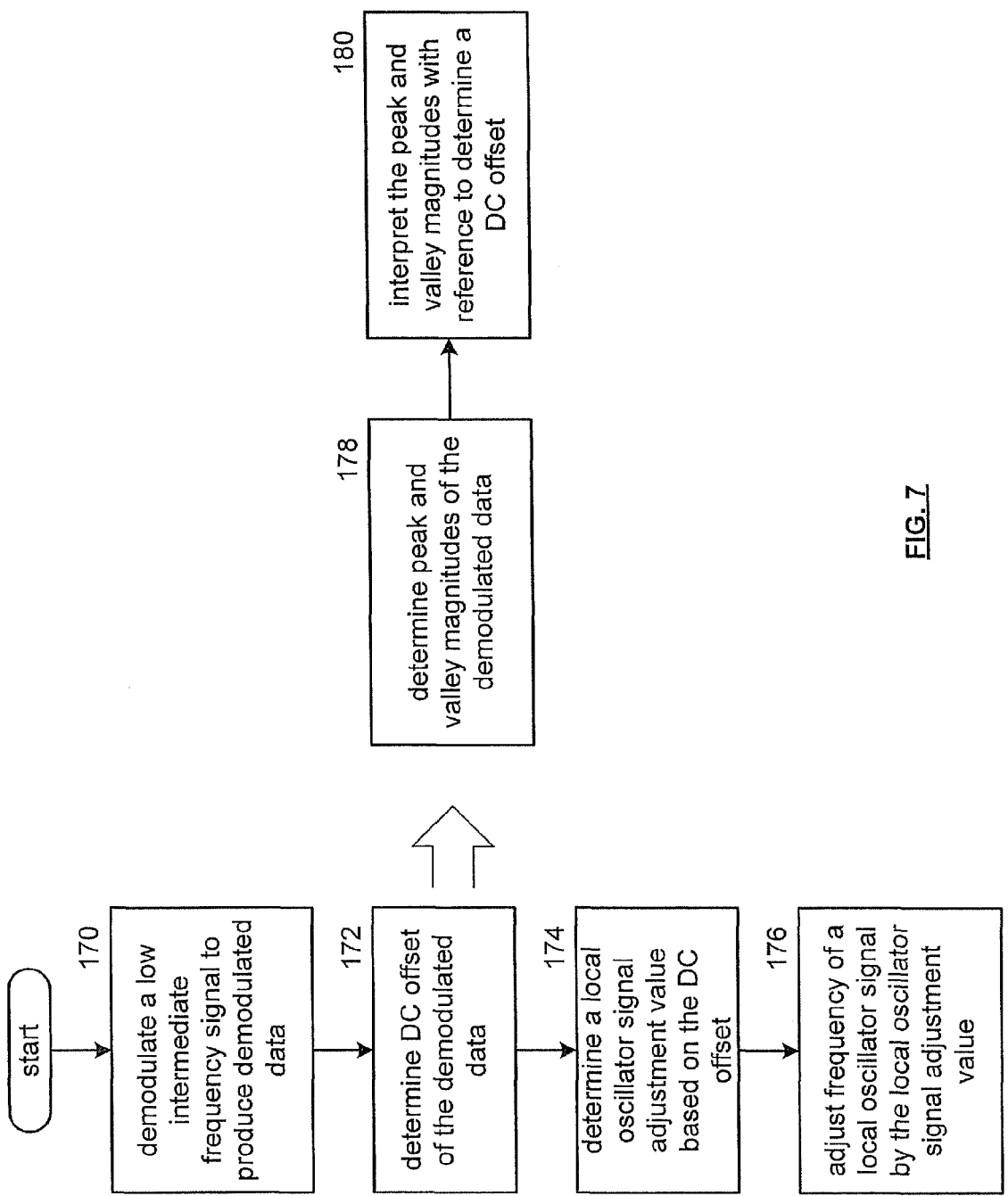
FIG. 7 illustrates a logic diagram of a method for DC offset compensation in an radio receiver in accordance with an embodiment of the present invention.

FIG. 7 illustrates a flow diagram of a method for DC offset compensation in an radio receiver, in accordance with an embodiment of the invention. Referring to FIG. 7, the process begins at Step 170 where a low intermediate frequency signal may be demodulated to produce demodulated data. The process then proceeds to step 172 where a DC offset of the demodulated data may be determined. This may be done as illustrated in Steps 178 and 180. At step 178, peak and valley magnitudes of the demodulated data may be determined. Based on the peak and valley magnitudes, a midpoint value of the demodulated data may be determined. The process then proceeds to step 180 where the midpoint of the peak and valley magnitudes may be interpreted with reference to the zero magnitude to determine a DC offset.

Returning to the main flow of the flow diagram, the process proceeds to step 174 where a local oscillator signal adjustment value may be determined based on the DC offset. The process then proceeds to step 176 where the frequency of the local oscillator signal may be adjusted in accordance with the local oscillator signal adjustment value.

Figure 8:
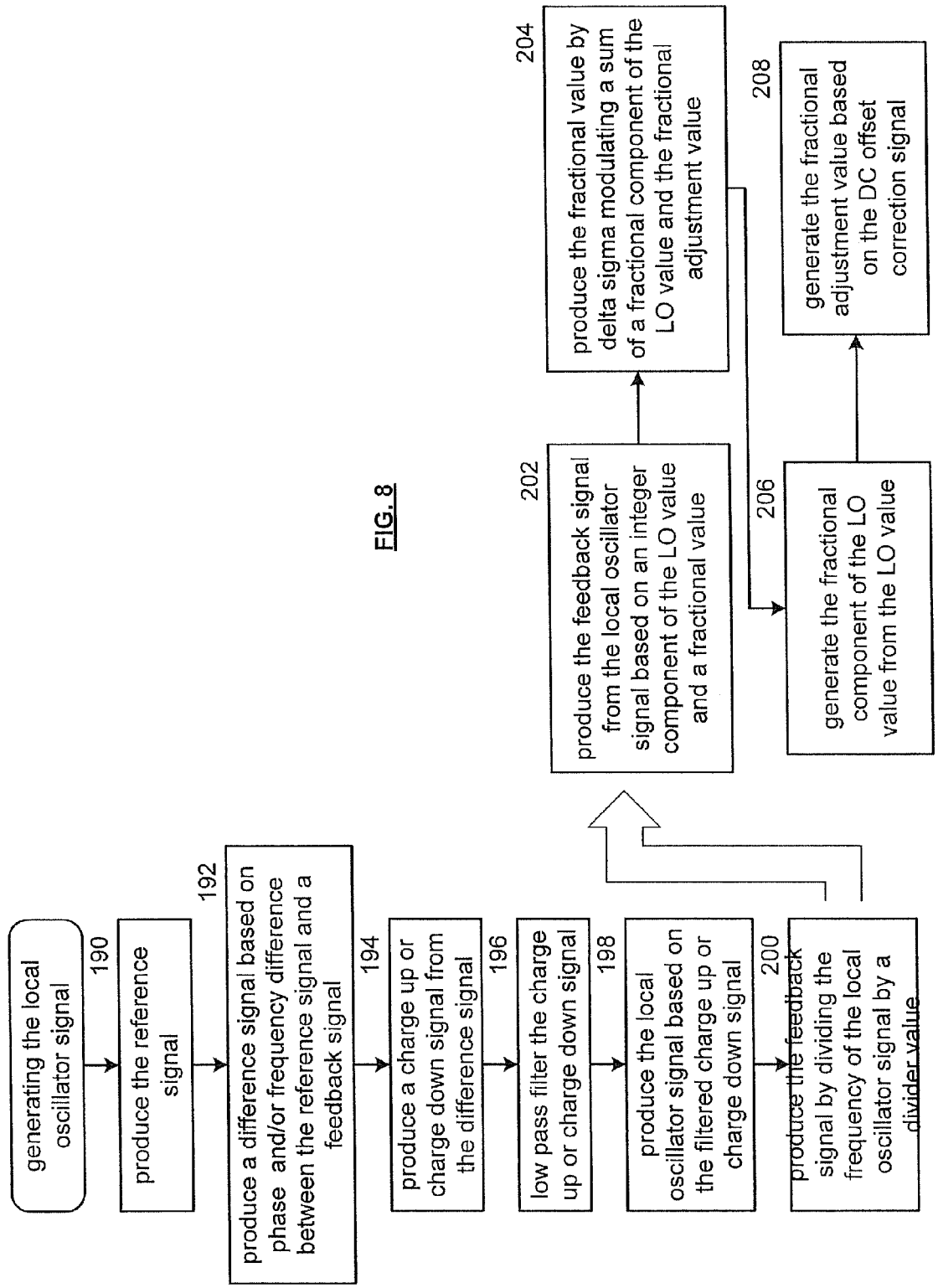
FIG. 8 illustrates a logic diagram that further describes the generating of the local oscillator of the logic diagram of FIG. 7, which may be utilized in connection with an embodiment of the present invention.

FIG. 8 illustrates a flow diagram that further describes the generating of the local oscillator signal of the logic diagram of FIG. 7, which may be utilized in connection with an embodiment of the invention. Referring to FIG. 8, the processing begins at step 190 where a reference signal may be produced. The process then proceeds to step 192 where a difference signal may be produced based on a phase and/or frequency difference between the reference signal and a feedback signal. The process then proceeds to step 194 where a charge-up or charge-down signal may be produced from the difference signal.

The process then proceeds to step 196 where the charge-up or charge-down signal may be low pass filtered to produce a filtered charge-up or charge-down signal. The process then proceeds to step 198 where a local oscillator signal may be produced based on the filtered charge-up or filtered charge-down signal. Alternatively, the local oscillator signal, generated by a self-correcting clock module, may be referred to as a recovery clock. The process then proceeds to step 200 where the feedback signal may be produced by dividing the frequency of the local oscillator signal by a divider value. The divider value may be in accordance with a predetermined local oscillator value and a fractional adjustment value that may be based on the DC offset correction signal. The predetermined local oscillator value may represent the divider value needed to produce the local oscillator signal from the reference signal without accounting for DC offset. The fractional adjustment value may cause the divider value to be adjusted such that the local oscillator signal frequency of the receiver may substantially match the local oscillator signal frequency of the transmitting radio.

The correction of the feedback signal may be further described with reference to steps 202-208. At step 202, the feedback signal may be produced from the local oscillator signal, or VCO output signal, based on the divider value, which may include an integer value and a fractional value. The process then proceeds to step 204 where the fractional value may be produced by a Delta Sigma modulation on a sum of a fractional component of the local oscillator value and the fractional adjustment value. The process then proceeds to step 206 where the fractional component of the local oscillator value may be generated based on the local oscillator value. The process then proceeds to step 208 where the fractional adjustment value may be generated based on the DC offset correction signal. This may be done by utilizing a lookup table to index one of a plurality of fractional adjustment values based on the DC offset correction signal and storing the fractional adjustment value. Alternatively, the fractional adjustment value may be calculated based on the DC offset correction signal.

In accordance with another embodiment of the invention, a receiver may comprise a low noise amplifier (LNA), a down conversion mixing module, a local oscillator module, a bandpass filter, a demodulation module, and a DC offset estimation module. The low noise amplifier, the down conversion mixing module, the bandpass filter, and the demodulation module may be operably coupled to recapture data from a received radio frequency (RF) signal. The local oscillator module may be operably coupled to generate the local oscillator signal based on a reference signal and a DC offset correction signal. The DC offset estimation module may be operably coupled to generate the DC offset correction signal based on a determined a DC offset. The DC offset estimation module may determine the DC offset prior to compensation of the local oscillator, such as during a test sequence and/or during a preamble. As such, the local oscillator may initially produce the local oscillator signal based on the reference signal and, once the DC offset correction signal has been determined, the receiver local oscillator signal frequency may be adjusted based on the determined DC offset to substantially match the local oscillator signal frequency of the transmitting radio.

The preceding discussion has presented a method and apparatus for directly compensating DC offset within a radio receiver. By adjusting the frequency of the local oscillator signal of the radio receiver to substantially match the frequency of the local oscillator signal of the transmitting radio, the DC offset is effectively removed from the radio receiver. As such, errors associated with DC offset are eliminated. Other embodiments may be derived from the teaching of the present invention, without deviating from the scope of the claims.

FIG. 9A illustrates an exemplary Bluetooth packet structure, which may be utilized in connection with an embodiment of the present invention. Referring to FIG. 9A, a general packet structure format for an exemplary Bluetooth packet 900 may comprise a channel access code 902, a header 904, a synchronization (sync) sequence 906, and a payload 908. In this regard, a portion of the Bluetooth packet 900 may also be referred to as a field. The channel access code 902 may comprise a portion of the Bluetooth packet 900 that may be utilized to identify packets on a particular physical channel and/or to exclude or ignore packets on a different physical channel that may be using the same radio frequency (RF)

carrier. All packets sent in the same physical channel may have a similar access code, for example.

The channel access code 902 may comprise 72 bits or it may comprise 68 bits when implemented in a shortened access code format, for example. In a receiver device, a sliding correlator may be utilized to correlate at least a portion of the contents of the channel access code 902. The sliding correlator may generate a trigger to indicate that a channel access code match has occurred when a threshold level has been exceeded, for example.

The header 904 may comprise a portion of the Bluetooth packet 900 that may be utilized for indicating to a receiving device when a particular packet is addressed to that device, the type of packet, a sequential numbering of the packet to order the data packet stream, and/or the manner in which the packet may be routed internally to that device, for example. The header 904 may be utilized in physical channels that support physical links, logical transports, and logical links. The header 904 may be implemented by utilizing a Forward Error Correction (FEC) repetition code with a ⅓ rate, for example. In this regard, for an FEC repetition code of ⅓ rate, 18 bits of the content in the header 904 may be repeated three times to produce a header 904 with a length of 54 bits.

The sync sequence 906 may comprise a portion of the Bluetooth packet 900 that may be utilized to synchronize the contents of the payload 908. This synchronization may be necessary for cases when the payload 908 may be modulated utilizing a different scheme than for other portions of the Bluetooth packet 900. The sync sequence 906 may comprise a plurality of symbols and may have a fixed phase rotation between a first or reference symbol and a last symbol. For example, the sync sequence 906 may comprise a time duration of 11 μs and may also comprise a phase rotation from the first reference symbol to the last symbol of $3\pi/2$. The payload 908 may comprise a portion of the Bluetooth packet 900 that may be utilized to transport user information. The sync sequence 906 and the payload 908 may comprise a total of up to 2745 bits.

The channel access code 902 and the header 904 may be modulated utilizing a Frequency Shift Keying modulation (FSK) scheme, for example. This modulation scheme may be utilized to provide backward compatibility between systems that support enhanced data rates (EDR), for example, 2 megabits per second (Mbps) transmissions or 3 Mbps transmissions, with systems that support slower data rates. In this regard, a receiving device that supports the slower data rates may be able to determine from the channel access code 902 and/or the header 904 that the current transmission is intended for a device that supports higher data rates. In an FSK modulation scheme, a plurality of equal-energy orthogonal signal waveforms that may differ in frequency may be generated. The FSK modulation scheme utilized for modulating the channel access code 902 and the header 904 may be a Gaussian FSK (GFSK) modulation scheme, for example, where the signal to be modulated may be filtered utilizing a Gaussian filter.

The sync sequence 906 and the payload 908 may be modulated utilizing a Phase Shift Keying (PSK) modulation scheme, for example. In a PSK modulation scheme, a plurality of equal-energy orthogonal signal waveforms that differ in phase may be generated. The PSK modulation scheme utilized for modulating the sync sequence 906 and the payload 908 may be a Differential PSK (DPSK) modulation scheme, for example, where differentially encoded phase information may be utilized. The DPSK modulation scheme may be an 8-DPSK modulation scheme or a $\pi/4$-DPSK modulation scheme, for example. The 8-DPSK may be utilized for 3 megabits per second (Mbps) transmissions and the $\pi/4$-DPSK modulation scheme may be utilized for 2 Mbps transmissions.

The FSK-based modulation scheme utilized for the channel access code 902 and the header 904 may require a larger signal-to-noise ratio (SNR) to demodulate than the PSK-based modulation scheme utilized for the sync sequence 906 and the payload 908. For example, in some instances, the FSK-based modulation scheme may require 14 dB of SNR to achieve a 1e-3 bit error rate (BER) while a PSK-based modulation scheme may require 10 dB of SNR to achieve a 1e-4 BER. Since the FSK-modulation scheme provides backward compatibility with prior technologies, it may be utilized for modulating the channel access code 902 and the header 904, even when it may result in a higher SNR requirement than for a PSK-based modulation.

FIG. 9B illustrates an exemplary channel access code portion of a Bluetooth packet structure, which may be utilized in connection with an embodiment of the present invention. Referring to FIG. 9B, the channel access code 902 in FIG. 9A may comprise a preamble 910, a sync word 912, and a trailer 914. The preamble 910 may comprise a fixed zero-one pattern of four symbols that may be utilized to facilitate the DC offset compensation. The fixed zero-one pattern may be 1010 when a first symbol of the sync word 912 is a logic 1, and may be 0101 when the first symbol of the sync word 912 is a logic 0. The sync word 912 may comprise a 64-bit code word that may be constructed to provide good auto correlation properties in order to improve timing acquisition. In this regard, the sync word 912 may be utilized to synchronize the incoming packet with the local timing information in the receiving device. The trailer 914 may comprise a fixed zero-one pattern of four symbols that may be utilized to facilitate an extended DC offset compensation. The fixed zero-one pattern may be 1010 when a last symbol of the sync word 912 is a logic 0, and may be 0101 when the last symbol of the sync word 912 is a logic 1.

Figure 10:
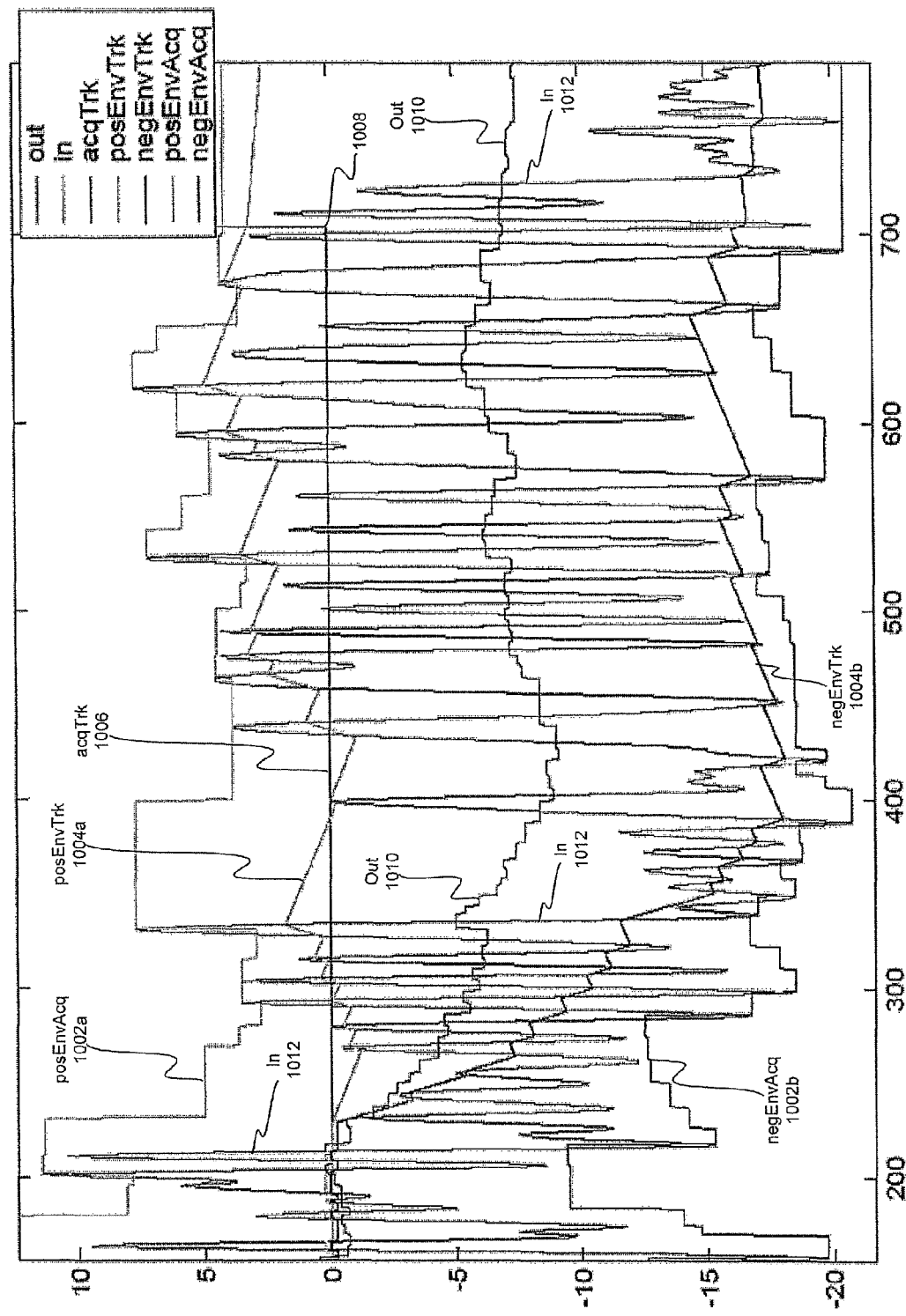
FIG. 10 is a graph illustrating the tracking of an input waveform, which is utilized for adjusting DC offset slice point in an RF receiver, in accordance with an embodiment of the present invention.

FIG. 10 is a graph illustrating tracking of an input waveform, which is utilized for adjusting DC offset slice point in an RF receiver, in accordance with an embodiment of the present invention. Referring to FIG. 10, there is shown a positive acquisition envelope (posEnvAcq) 1002a, a negative acquisition envelope (negEnvAcq) 1002b, a positive tracking envelope (posEnvTrk) 1004a, a negative tracking envelope (negEnvTrk) 1004b, an input signal (In) 1012, an output signal (Out) 1010, and a tracking signal (Trk) 1006. FIG. 10 illustrates an exemplary scenario in which a receiver frequency may be less than a transmitter frequency since the DC offset slice point lies below the DC reference 0 on the vertical axis.

The acquisition envelopes posEnvAcq 1002a and negEnvAcq 1002b may respond quickly to changes of the input signal In 1012. The positive acquisition envelope posEnvAcq 1002a may quickly follow the input signal In 1012 when it increases, while not following as quickly when the signal decreases. Similarly, The negative acquisition envelope negEnvAcq 1002b may quickly follow the input signal In 1012 when it decreases, while not following as quickly when the signal increases. This will be illustrated in FIG. 11. The tracking envelopes posEnvTrk 1004a and negEnvTrk 1004b may respond more slowly to changes in the input signal In 1012. This will be illustrated in FIG. 12.

The tracking envelopes may be regarded as damped response signals to the input signal In 1012. The output signal Out 1010 may be generated from acquisition mode envelopes posEnvAcq 1002a and negEnvAcq 1002b and/or the tracking mode envelopes posEnvTrk 1004a and negEnvTrk 1004b.

The tracking signal Trk 1006 may indicate when tracking occurs after recognizing and synchronizing the SYNC word. In this regard, synchronization may occur at 1008, at which time the tracking signal Trk 1006 may be asserted. Acquisition mode occurs prior to the tracking signal Trk 1006 being asserted, and tracking mode occurs after the tracking signal Trk 1006 being asserted.

In operation, the input signal In 1012 may be converted to digital values, and the digital values may be processed to generate the acquisition envelopes posEnvAcq 1002a and the negEnvAcq 1002b, and the tracking envelopes posEnvTrk 1004a and the negEnvTrk 1004b. During acquisition period, the output signal Out 1010 may be based on a weighted average of the four envelopes. In this regard, the output signal Out 1010 may be:

Out=(posEnvAcq 1002a+negEnvAcq 1002b)*(Acq-Weight)+(posEnvTrk 1004a+negEnvTrk 1004b)*(TrkWeight)

The weight values AcqWeight and TrkWeight may be design and/or implementation dependent. Therefore, the input signal In 1012 may be compared to the output signal Out 1010, and the value of the output signal Out 1010 may be the slicing point at that time for the input signal In 1010. If the value of the input signal In 1012 is higher than the value of the slice point, or the output signal Out 1010 at that time, then the signal may be identified as logic one (1). Similarly, a signal value lower than the slice point value may be identified as logic zero (0).

After the synchronization period, for example, when the tracking signal TRK 1006 is asserted after the synchronization point 1008, the output signal Out 1010 may be based on an average of the two tracking envelopes posEnvTrk 1004a and negEnvTrk 1004b. In this regard, the output signal Out 1010 may be:

Out=[(posEnvTrk 1004a+negEnvTrk 1004b)/2.

However, it may still be desirable at times to generate the output signal Out 1010 using all four envelopes even after the synchronization period. For example, the output signal Out 1010 may be generated using all four envelopes when the input signal In 1012 is changing rapidly.

Although an embodiment of the invention may have specified digital values, the invention need not be so limited. The slice points may be determined utilizing a digital circuit, analog circuit, and/or a processor, for example, or a digital signal processor (DSP) that may be executing code. Additionally, a combination of digital hardware, analog hardware and/or a DSP may be utilized to implement an embodiment of the invention.

The following is an exemplary code listing that may be utilized for generating estimates of the DC offset, which may be utilized for adjusting DC offset slice points in an RF receiver, in accordance with an embodiment of the invention.

```
// BP1
    if (InaRssiOut < p.LnaThresh) {
        VposEnvTrk = 0;
        VnegEnvTrk = 0;
    }
// BP2
    // Accumulate for tracking
    VposEnvTrk += (Input>double(TI(VposEnvTrk)))?TT(lrgEnvDelta):
        TT(-smlEnvDelta);
    VnegEnvTrk +=
    (Input<TI(VnegEnvTrk))?TT(-lrgEnvDelta):TT(smlEnvDelta);
```

-continued

```
// BP3
    if (!acqTrkZ) { // While waiting to sync
        // Get the direction of input change
        sigSlope = ((Input-InputZ)>=0);
        sigZero = (Input==InputZ);
// BP4
    // Slope direction change means extremum detected
    if (((sigSlopeZ!=sigSlope)||(sigZero!=sigZeroZ))&&!sigZero) {
        // Some useful differences
        pDiff = TI(VposEnvAcq) – InputZ;
        nDiff = InputZ – TI(VnegEnvAcq);
// BP5
    if (!sigSlope) { // If Max...
// BP6
        if (pDiff<0)
            VposEnvAcq = InputZ;
// BP7
        else if ((nDiff>(p.acqThreshSel?12:8)) && (nDiff>=0))
            VposEnvAcq –= pDiff/((pDiff>6)?2:(pDiff>2)?4:8);
    }
    else {       // Else if min...
// BP8
        if (nDiff<0)
            VnegEnvAcq = InputZ;
// BP9
        else if ((pDiff>(p.acqThreshSel?12:8)) && (pDiff>=0))
            VnegEnvAcq += nDiff/((nDiff>6)?2:((nDiff>2)?4:8));
    }
// BP10
        Output = (TI(VposEnvAcq) + TI(VnegEnvAcq))*p.AcqWgt
            + (TI(VposEnvTrk) + TI(VnegEnvTrk))*p.TrkWgt;
}
//BP11
    // Register update
    sigSlopeZ = sigSlope;
    sigZeroZ = sigZero;
    }
// BP12
    else if (p.enDefault)    // After sync
        Output = (TI(VposEnvTrk) + TI(VnegEnvTrk))/2; //.
```

In the code above, all the variables used may have signed values. However, this need not be limited in this manner. The specific types used for the variables may depend on the type of processor that may be used. Additionally, TI and TT may be parts of templates that allow variables to be defined as dictated by function declarations. For example, a variable may have an attribute as a fixed point variable and the number of bits to the left of the decimal point may be fixed.

Accordingly, in the code above, at the line BP1, a value of an input signal strength variable InaRssiOut may be compared to the value of a threshold variable p.LnaThresh. If the value of the input signal strength variable InaRssiOut is less than the value of the threshold variable p.LnaThresh, then acquisition mode may be entered by setting the values of variables VposEnvTrk and VnegEnvTrk to zeros. These two variables may correspond to the tracking envelopes posEnvTrk 1004a and negEnvTrk 1004b.

At line BP2, the value of the present input variable Input may be compared to the values of the variables VposEnvTrk and VnegEnvTrk. If the value of the input variable Input is larger than the value of the variable VposEnvTrk, the variable VposEnvTrk may be increased by an appropriate amount lrgEnvDelta. If the value of the variable Input is less than or equal to the value of the variable VposEnvTrk, the value of the variable VposEnvTrk may be decreased by an appropriate amount smlEnvDelta. Similarly, if the value of the variable Input is smaller than the value of the variable VnegEnvTrk, the value of the variable VposEnvTrk may be decreased by an appropriate amount lrgEnvDelta. If the value of the variable Input is greater than or equal to the value of the variable VposEnvTrk, the value of the variable VposEnvTrk may be increased by an appropriate amount smlEnvDelta. In this manner, the increases and decreases in the values of the variables VposEnvTrk and VnegEnvTrk may be fixed values. These values may be design and/or implementation dependent.

At line BP3, a variable ackTrkZ may be checked. The value of zero may indicate that acquisition mode is in progress. The value of non-zero may indicate that tracking mode is in progress. Accordingly, if acquisition mode is in progress, the code described for line BP3 to line BP11 may apply. If acquisition mode is not in progress, that is, tracking mode is in progress, the code described for line BP12 may apply. Therefore, if acquisition mode is in progress, a variable sigSlope may be assigned a value of one if the value of the variable Input is greater than or equal to the value of the previous input variable InputZ. Otherwise, a value of zero may be assigned to the variable sigSlope.

Additionally, a variable sigZero may be assigned a value of one if the value of the variable Input is equal to the value of the previous input variable InputZ. Otherwise, the variable sigZero may be assigned a value of zero. A value of one for the variable sigSlope may indicate that the slope of the input signal is flat or it is rising. A value of zero may indicate that the slope of the input signal is falling. A value of one for the variable sigZero may indicate that there was no change in the input signal and a value of zero may indicate that there was a change in the input signal.

At line BP4, it is determined whether a change in direction of the slope has been detected. This may indicate that a local maximum or a local minimum, either of which may be referred to as an extremum, may have been detected. In order to identify this condition, the code may determine whether there is a change in the input signal value, and if either the value of the variable sigSlope changed from a one to a zero, or vice versa, or if the value of variable sigZero changed from a one to a zero, or vice versa. If an extremum is detected, the code described for the rest of line BP4 to line BP10 may apply. Otherwise, there may be a jump in execution of the code to the code described for line BP11.

Therefore, if an extremum is detected, a variable pDiff may be assigned a value of the variable VposEnvAcq minus the value of the previous input variable InputZ, and a variable nDiff may be assigned a value of the previous input variable InputZ minus the value of the variable negEnvAcq. These two variables VposEnvAcq and VnegEnvAcq may correspond to the acquisition envelopes posEnvAcq 1002*a* and negEnvAcq 1002*b*. At line BP5, it may be determined whether the variable sigSlope has a value of zero, that is, if the variable sigSlope indicates that the slope is falling. Since there was a change in slope direction, the previous slope may have been rising. This may indicate that a local maximum may have been detected. Therefore, the value of the variable VposEnvAcq may need to be changed. At line BP6, it may be determined whether the value of the variable pDiff is less than zero, that is, if the value of the variable VposEnvAcq is less than the value of the previous input variable InputZ. If so, the value of the variable VposEnvAcq may be set to the value of the previous input variable InputZ. If the value of the variable pDiff is not less than zero, then it may be determined at line BP7 whether the value of the variable nDiff is greater than a selectable threshold value. The specific threshold values that may be selected, and the specific threshold value selected for use, may be design and/or implementation dependent.

If the value of the variable nDiff is greater than the threshold value selected, then the value of the variable VposEnvAcq may be decreased by an amount that may be correlated to the amount by which the value of the variable VposEnvAcq is greater than the value of the previous input variable InputZ. Accordingly, while the value of the variable VposEnvAcq may be set equal to the higher input signal value, it may not be set equal to the lower input signal value. Rather, the amount reduced for the value of the variable VposEnvAcq may be related to the value of the variable VnegEnvAcq and how much larger the previous input signal value may be than the value of the variable VposEnvAcq.

At line BP8, since an extremum was detected and it was not a local maximum, a similar process may take place for the local minimum that was detected. If the value of the variable nDiff is less than zero, that is, if the value of the previous input variable InputZ is less than the value of the variable VnegEnvAcq, then the value of the variable VnegEnvAcq may be set to the value of the previous input variable InputZ. If the value of the variable nDiff is not less than zero, then, at line BP9, it may be determined whether the value of the variable pDiff is greater than a selectable threshold value. The specific threshold values that may be selected, and the specific threshold value selected for use, may be design and/or implementation dependent.

If the value of the variable pDiff is greater than the threshold value selected, then the value of the variable VnegEnvAcq may be increased by an amount that may be correlated to the amount by which the value of the previous input variable InputZ may be greater than the value of the variable VnegEnvAcq. Accordingly, the value of the variable VnegEnvAcq may be set equal to the value of the previous input variable InputZ if the absolute value of the previous input variable InputZ is greater than the absolute value of the variable VnegEnvAcq. Otherwise, the amount added to the value of the variable VnegEnvAcq may be related to how much larger the absolute value of the previous input variable InputZ is than the absolute value of the variable VnegEnvAcq.

At line BP10, a variable Output may be generated by adding two terms. The first term may be generated by adding the value of the variable VposEnvAcq to the value of the variable VnegEnvAcq, and then multiplying by an acquisition weight. The second term may be generated by adding the value of the variable VposEnvTrk to the value of the variable VnegEnvTrk, and then multiplying by a tracking weight. The variable Output may correspond to the output signal Out 1010 and may be the value of the DC offset. At line BP11, the variables sigSlopeZ and sigZeroZ may be assigned the values of the variables sigSlope and sigZero, respectively.

At line BP12, if acquisition mode is not in progress, it may be determined whether the tracking mode calculation may be used for the variable Output. This may usually be enabled. The tracking mode calculation for the variable Output may average the values of the two variables VposEnvTrk and VnegEnvTrk.

Figure 11A:
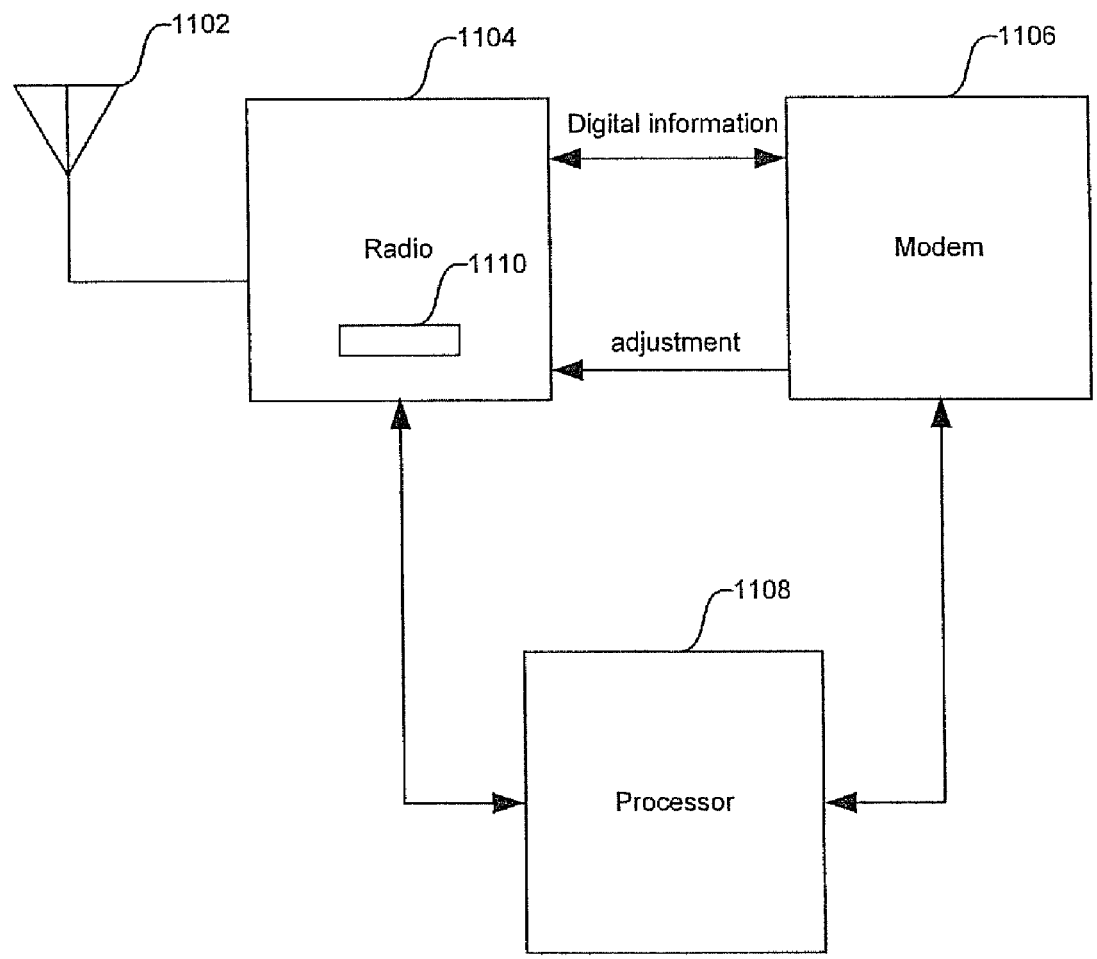
FIG. 11A illustrates a block diagram of an exemplary radio and a modem in accordance with an embodiment of the present invention.

FIG. 11A illustrates a block diagram of an exemplary radio and a modem in accordance with an embodiment of the present invention. Referring to FIG. 11A, an exemplary transceiver system may comprise an antenna 1102, a radio 1104, a modem 1106, and a processor 1108. The antenna 1102 may be utilized to receive and transmit information in at least one radio frequency. The radio 1104 may comprise suitable logic, circuitry, and/or code that may be adapted to generate a signal to be transmitted and/or received. The radio 1104 may also comprise a phase locked loop (PLL) trim register 1110 that may be adapted to change and/or modify the frequency of a local oscillator. The modem 1106 may comprise suitable logic, circuitry, and/or code that may be adapted to process digital information before transmission and after reception, for example. The processor 1108 may comprise suitable logic, circuitry, and/or code that may be adapted to control at least a portion of the operations of the radio 1104 and/or the modem 1106.

In operation, the modem 1106 may adjust the PLL trim register 1110 when a DC offset is estimated as a result of the difference between an RF transmitter frequency, $f_T$, and the receiver frequency of the radio 1104, $f_R$, for example. In this case, the modem 1106 may indicate via a frequency adjustment signal and/or a counter signal that the radio 1104 may need to either increase or decrease the oscillator frequency to better match that of the RF transceiver. For example, the radio 1104 may have a nominal oscillator frequency of 2.412 GHz and may be operating at 2.412125 GHz. The modem 1106 may indicate that to reduce the estimated DC offset as determined during the slicing operation, the PLL trim register may be updated to, for example, an oscillator frequency of 2.412060 GHZ when the maximum offset supported is ±65 KHz or 30 parts-per-million (ppm).

Figure 11B:
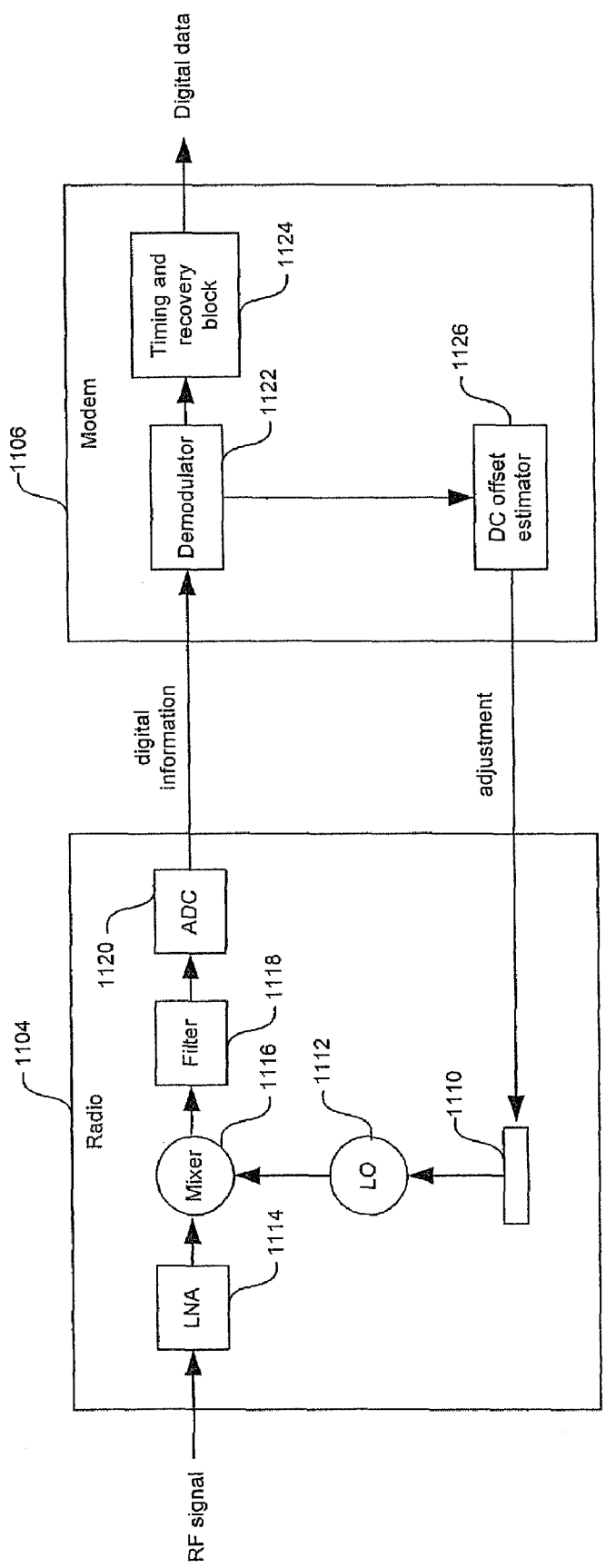
FIG. 11B illustrates an exemplary radio and modem for coarse frequency adjustment in accordance with an embodiment of the present invention.

FIG. 11B illustrates an exemplary radio and modem for coarse frequency adjustment in accordance with an embodiment of the present invention. Referring to FIG. 11B, the radio 1104 and the modem 1106 in FIG. 11A are shown in more detail. The radio 1104 may comprise a low-noise amplifier (LNA) 1114, a mixer 1116, a filter 1118, an analog-to-digital converter (ADC) 1120, a local oscillator (LO) 1112, and the PLL trim register 1110. The LNA 1114 may be substantially as the LNA 72 shown in FIG. 3. The mixer 1116 may be substantially as the down conversion module 70 shown in FIG. 3. The filter 1118 may be substantially as the filtering/gain module 68 shown in FIG. 3. The ADC 1120 may be substantially as the analog-to-digital converter 66 shown in FIG. 3. The LO 1112 may be substantially as the local oscillator module 74 shown in FIG. 3. The LO 1112 may generate a signal with a frequency The modem 1106 may comprise a demodulator 1122, a timing and recovery block 1124, and a DC offset estimator 1126. The demodulator 1122 may be substantially as the IF demodulator 102 shown in FIG. 3. The timing and recovery block 1124 may be substantially as the timing and recovery module 108 shown in FIG. 3. The DC offset estimator 1126 may be substantially as the DC offset estimation module 104 shown in FIG. 3.

In operation, an RF signal has an RF transmitter frequency, $f_T$, and is amplified by the LNA 1114. The amplified signal is then downconverted at the mixer 1116 by a signal based on the receiver frequency, $f_R$, that is generated by the LO 1112. The downconverted signal is filtered by the filter 1118 and digitized by the ADC 1120. The digitize information is then demodulated by the demodulator 1122 in the modem 1106. Information from the demodulated signal may be utilized by the DC offset estimator 1126 to generate a coarse adjustment signal that may modify the contents of the PLL trim register 1110 in the radio 1104. Updating the register values may vary the receiver frequency to bring it within a specified threshold value range.

Figure 12:
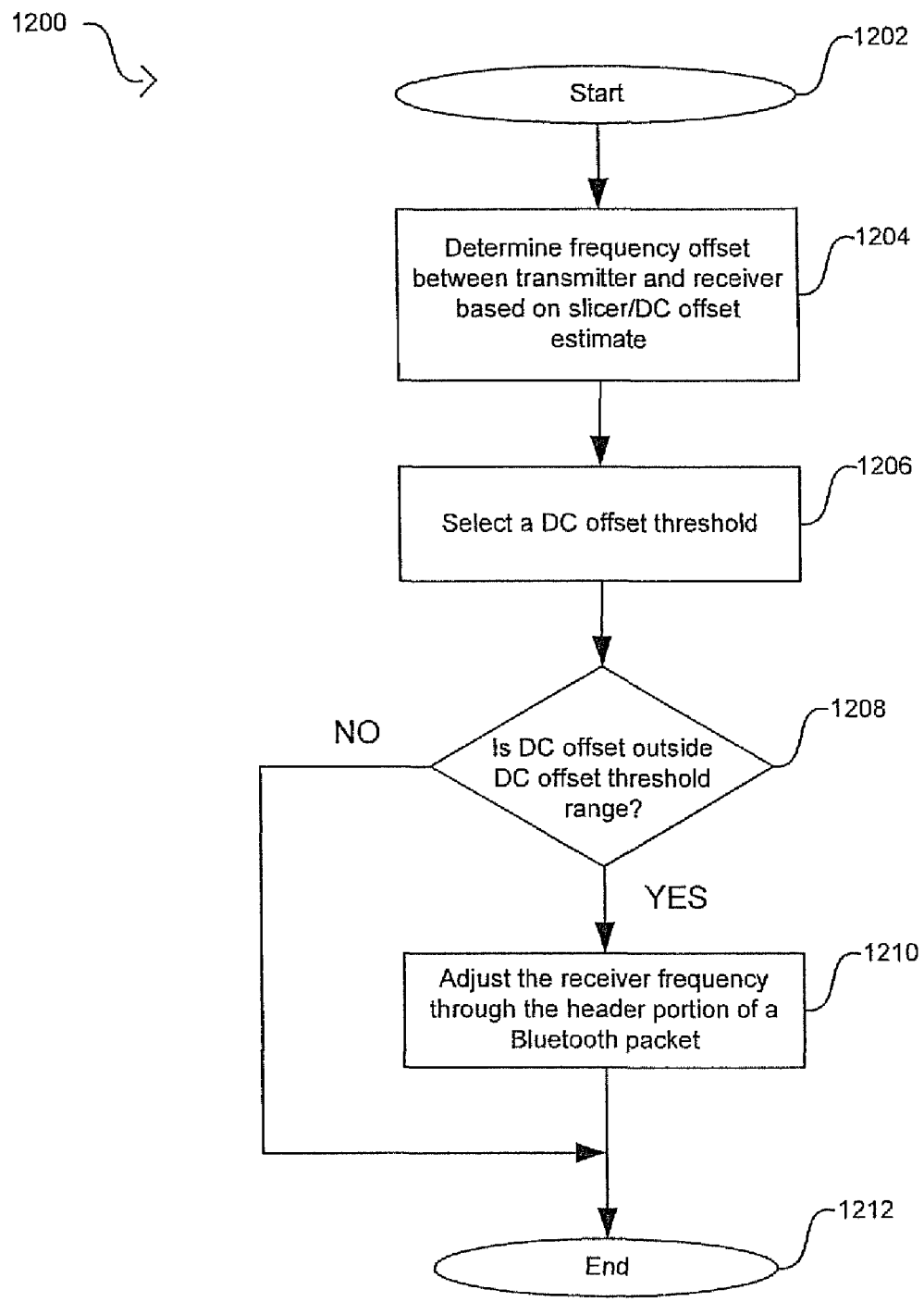
FIG. 12 illustrates a flow diagram with exemplary steps for frequency feedback adjustment in digital receivers in accordance with an embodiment of the present invention.

FIG. 12 illustrates a flow diagram with exemplary steps for frequency feedback adjustment in digital receivers in accordance with an embodiment of the present invention. Referring to FIG. 12, after start step 1202, in step 1204, the frequency difference or frequency offset between an RF receiver and an RF transmitter may be determined and/or estimated from the DC offset estimate determined as a result of the slicing process in the DC offset estimator 1126 in FIG. 11B. In step 1206, a DC offset threshold and/or corresponding frequency offset threshold may be selected in accordance with technical specifications and/or requirements. For example, the frequency offset estimate for Bluetooth applications may not exceed ±30 KHz, or a corresponding parts-per-million (ppm) of the intended frequency, in some instances. The threshold value to be utilized may be inclusive, that is, a current DC offset estimate or frequency offset estimate equal to the threshold value may be considered to be within the accepted range. For example, when the threshold value range is ±30 KHz, a DC offset estimate of +30 KHz may be considered to be included in the range of the threshold value while a DC offset estimate of −30.05 KHz may not be considered to be included in the range of the threshold value. In other instances, the threshold value may not be inclusive. For example, when the threshold value range in ±30 KHz, a DC offset estimate of +30 KHz may not be considered to be included in the range of the threshold value.

In step 1208, a determination may be made as to whether the current DC offset estimate or the frequency offset estimate is larger than the selected threshold value. When the current DC offset estimate or frequency offset is less than the threshold value, the flow diagram 1200 may proceed to end step 1212 and no adjustment of the RF receiver frequency may be necessary. When the DC offset estimate or the frequency offset estimate is larger than the selected threshold value, the flow diagram 1200 may proceed to step 1210. The range of the threshold value may be symmetric or asymmetric. For example, an asymmetric threshold value range may be −29.5 KHz/+29.75 KHz while a symmetric threshold value range may be −29.5 KHz/+29.5 KHz. The threshold value may also be selected dynamically to provide more flexibility in the operation of an RF receiver. In step 1210, the receiver frequency, $f_R$, may be adjusted by monitoring the header 904 in FIG. 9A and modifying the PLL trim register 1110 in accordance with the results from monitoring the header 904. The header 904 may provide a good monitoring location since it utilizes a ⅓ rate FEC that allows for each bit of the contents of the header 904 to be repeated three times. The receiver frequency, $f_R$, may be adjusted slowly so as to not affect the slicing process. Once the RF receiver frequency is adjusted to within the requirements and/or specifications necessary, the flow diagram 1200 may proceed to end step 1212.

One embodiment of the invention may provide, a machine-readable storage having stored thereon, a computer program having at least one code section for signal processing. The at least one code section may be executable by a machine for causing the machine to perform steps for a frequency feedback adjustment in digital receivers as described herein.

The approach described herein may allow an RF receiver to operate, in some instances, without the need for an equalizer. In this regard, the power consumed by the RF receiver may be minimized and/or the overall cost of the RF receiver may be reduced.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
    monitoring a transmitter frequency during a channel access code portion of a packet communicated via a wireless interface;
    determining a DC offset estimate between said transmitter frequency and a receiver frequency; and
    adjusting said receiver frequency during a header portion of said packet based on said determined DC offset estimate when said determined DC offset estimate is outside a range of a threshold value.

2. The method according to claim 1, comprising dynamically modifying said range of said threshold value.

3. The method according to claim 1, wherein said range of said threshold value is symmetrical.

4. The method according to claim 1, comprising dynamically adjusting said receiver frequency.

5. The method according to claim 1, comprising generating a frequency adjustment signal for decreasing said receiver frequency.

6. The method according to claim 1, comprising generating a frequency adjustment signal for increasing said receiver frequency.

7. The method according to claim 1, comprising modifying at least one register bit to decrease said receiver frequency.

8. The method according to claim 1, comprising modifying at least one register bit to increase said receiver frequency.

9. The method according to claim 1, comprising generating a counter value for adjusting said receiver frequency.

10. The method according to claim 1, comprising determining said DC offset estimate via DC offset slicing.

11. A system for signal processing, the system comprising:
    one or more circuits that are operable to monitor a transmitter frequency during a channel access code portion of a packet communicated via a wireless interface;
    said one or more circuits are operable to determine a DC offset estimate between said transmitter frequency and a receiver frequency; and
    said one or more circuits are operable to adjust said receiver frequency during a header portion of said packet based on said determined DC offset estimate when said determined DC offset estimate is outside a range of a threshold value.

12. The system according to claim 11, wherein said one or more circuits are operable to dynamically modify said range of said threshold value.

13. The system according to claim 11, wherein said range of said threshold value is symmetrical.

14. The system according to claim 11, wherein said one or more circuits are operable to dynamically adjust said receiver frequency.

15. The system according to claim 11, wherein said one or more circuits are operable to generate a frequency adjustment signal for decreasing said receiver frequency.

16. The system according to claim 11, wherein said one or more circuits are operable to generate a frequency adjustment signal for increasing said receiver frequency.

17. The system according to claim 11, wherein said one or more circuits are operable to modify at least one register bit to decrease said receiver frequency.

18. The system according to claim 11, wherein said one or more circuits are operable to modify at least one register bit to increase said receiver frequency.

19. The system according to claim 11, wherein said one or more circuits are operable to generate a counter value for adjusting said receiver frequency.

20. The system according to claim 11, wherein said one or more circuits are operable to determine said DC offset estimate via DC offset slicing.

* * * * *